United States Patent
Ito et al.

(10) Patent No.: US 12,135,345 B2
(45) Date of Patent: Nov. 5, 2024

(54) PULSE EDGE DETECTION CIRCUIT

(71) Applicant: DENSO CORPORATION, Kariya (JP)

(72) Inventors: Takasuke Ito, Kariya (JP); Tomohiro Nezuka, Kariya (JP); Yasuaki Aoki, Kariya (JP); Yuuta Nakamura, Kariya (JP); Takashi Yoshiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 155 days.

(21) Appl. No.: 17/942,216

(22) Filed: Sep. 12, 2022

(65) Prior Publication Data
US 2023/0003780 A1 Jan. 5, 2023

Related U.S. Application Data

(63) Continuation of application No. PCT/JP2021/009268, filed on Mar. 9, 2021.

(30) Foreign Application Priority Data

Mar. 31, 2020 (JP) ................. 2020-063186

(51) Int. Cl.
G01R 29/02 (2006.01)
G01R 19/165 (2006.01)

(52) U.S. Cl.
CPC ....... *G01R 29/02* (2013.01); *G01R 19/16576* (2013.01)

(58) Field of Classification Search
CPC .......................... G01R 29/02; G01R 19/16576
See application file for complete search history.

(56) References Cited

U.S. PATENT DOCUMENTS

| | | | |
|---|---|---|---|
| 6,178,212 B1 * | 1/2001 | Akashi | H04L 7/02 375/375 |
| 2017/0299637 A1 * | 10/2017 | Seon | G01R 19/10 |
| 2019/0089346 A1 * | 3/2019 | Kawai | H03K 17/284 |

FOREIGN PATENT DOCUMENTS

| | | | | |
|---|---|---|---|---|
| JP | S63-163028 U | | 10/1988 | |
| JP | H09162931 A | * | 6/1997 | ............... H03K 5/08 |
| JP | 2000224014 A | * | 8/2000 | ........... H03K 5/1532 |

OTHER PUBLICATIONS

Translation of JP2000224014A (Year: 2000).*
Translation of JP2015231135A (Year: 2015).*
Translation of JPH0727695Y2 (Year: 1995).*
Translation of JPS63163028U (Year: 1988).*
Kawai, Shusuke et al. 15.8 A 4.5V/ns Active Slew-Rate-Controlling Gate Driver with Robust Discrete-Time Feedback Technique for 600V Superjunction MOSFETs, 2019 IEEE International Solid-State Circuits Conference (ISSCC) 3 pages.

* cited by examiner

*Primary Examiner* — Paresh Patel
(74) *Attorney, Agent, or Firm* — Posz Law Group, PLC

(57) ABSTRACT

In a pulse edge detection circuit, a measurement circuit has a comparator provided therein which compares a voltage with a reference voltage and outputs a pulse signal. An RSFF puts a signal in a high level at a timing at which detecting a rise edge due to a change of the pulse signal to the high level. In such manner, a set signal of an RSFF becomes inactive and a reset signal of the RSFF becomes active, and a fall edge of the pulse signal becomes detectable. When a fall edge is generated due to a change of the pulse signal from the high level to the low level, the set signal of the RSFF becomes active, and a signal becomes high level.

17 Claims, 21 Drawing Sheets

PULSE EDGE DETECTION CIRCUIT

CROSS REFERENCE TO RELATED APPLICATION

The present application is a continuation application of International Patent Application No. PCT/JP2021/009268 filed on Mar. 9, 2021, which designated the U.S. and claims the benefit of priority from Japanese Patent Application No. 2020-63186 filed on Mar. 31, 2020. The entire disclosures of all of the above applications are incorporated herein by reference.

TECHNICAL FIELD

The present disclosure relates to a circuit that detects an edge of a pulse signal generated in response to a change in a voltage signal.

BACKGROUND

Conventionally, a bridge circuit including switching elements for driving a load has been known.

SUMMARY

According to an aspect of the present disclosure, a first and second edge detection units are configured to output a first and second edge detection signals, respectively, at timings when first and second edges are generated in a pulse signal.

BRIEF DESCRIPTION OF THE DRAWINGS

The above and other objects, features and advantages of the present disclosure will become more apparent from the following detailed description made with reference to the accompanying drawings.

In the drawings.

DETAILED DESCRIPTION

Figure 1:
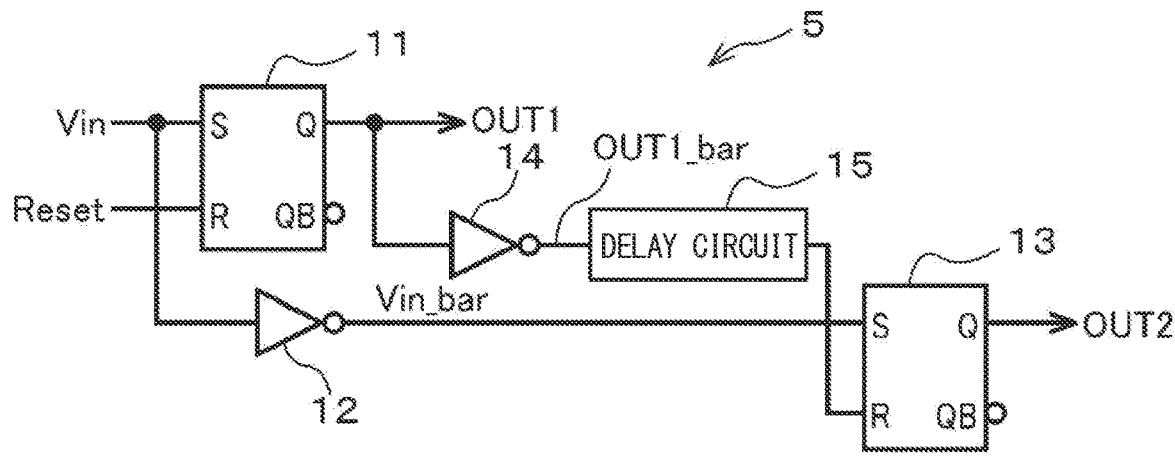
FIG. 1 is a diagram of a pulse edge detection circuit in a first embodiment.

Hereinafter, examples of the present disclosure will be described.

According to an example of the present disclosure, a configuration is employable that adjusts timing of a gate signal that is input to a switching element based on a measurement result of a load signal generated in association with a switching operation of switching elements that form a bridge circuit for driving a load.

It is noted that, in a case where a bridge circuit such as an inverter drives a motor, for example, a surge voltage generated by switching of a switching element changes at high speed. Further, a large amount of noise is generally generated in an environment in which a motor is driven and controlled. Therefore, it is inevitable that the environment is affected by the noise.

In such an environment, for example, in order to measure a period during which the surge voltage exceeds a certain reference voltage, one may assume that such a period may be detectable by detecting edges of pulse signals generated by comparing the voltage signal with a reference voltage.

However, the edge interval is in an order of nanosecond. Therefore, it becomes difficult to detect the edge interval. Further, when edge detection is performed by an analog circuit, the circuit area size may become large, and when the edge detection is performed by a digital circuit, it is difficult to implement a high-speed clock signal when the circuit is formed by using a high breakdown voltage process. That is, it is still difficult to detect the edges.

According to an example of a pulse edge detection circuit, one of a rise edge and a fall edge of a pulse signal output by a comparator comparing a voltage signal with a threshold voltage is designated as a first edge, and an other of a rise edge and a fall edge of a pulse signal is designated as a second edge. A first and second edge detection units output a first and second edge detection signals, respectively at timings when first and second edges are generated. Regarding such a detection, in the second edge detection unit, a timing at which the second edge can be detected is controlled by the first edge detection signal.

In a pulse signal, one edge is generated followed by the other edge. Therefore, the timing at which the second edge detection unit can detect the second edge is controlled by the first edge detection signal output by the first edge detection unit at the timing at which the first edge is generated. As a result, even when the generation interval between the two edges is short because the pulse signal is at a high speed, the second edge detection unit is enabled to detect the second edge without using a high speed clock signal.

According to an example, the pulse edge detection circuit includes first and second clock synchronization circuits that output the first and second edge detection signals in synchronization with the clock signal, respectively. With such a configuration, the generation timing of the first and second edges detected by the first and second edge detection units can be represented by using a cycle of the synchronization clock signal, which serves as a unit of minimum duration of time.

First Embodiment

Hereinafter, the first embodiment will be described with reference to FIGS. 1 to 5. As shown in FIG. 4, a series circuit of the N-channel MOSFETs 1P and 1N constitutes one phase of a three-phase inverter circuit 2, and is connected to a DC power supply 3. The inverter circuit 2 drives, for example, a three-phase motor (not shown). A measurement circuit 4 composed of a comparator is connected at a position between a drain and a source of the FET 1N. The measurement circuit 4 compares a drain-source voltage Vds of the FET 1N with a reference voltage, which is a threshold voltage, and outputs a pulse signal Vin.

Figure 5:
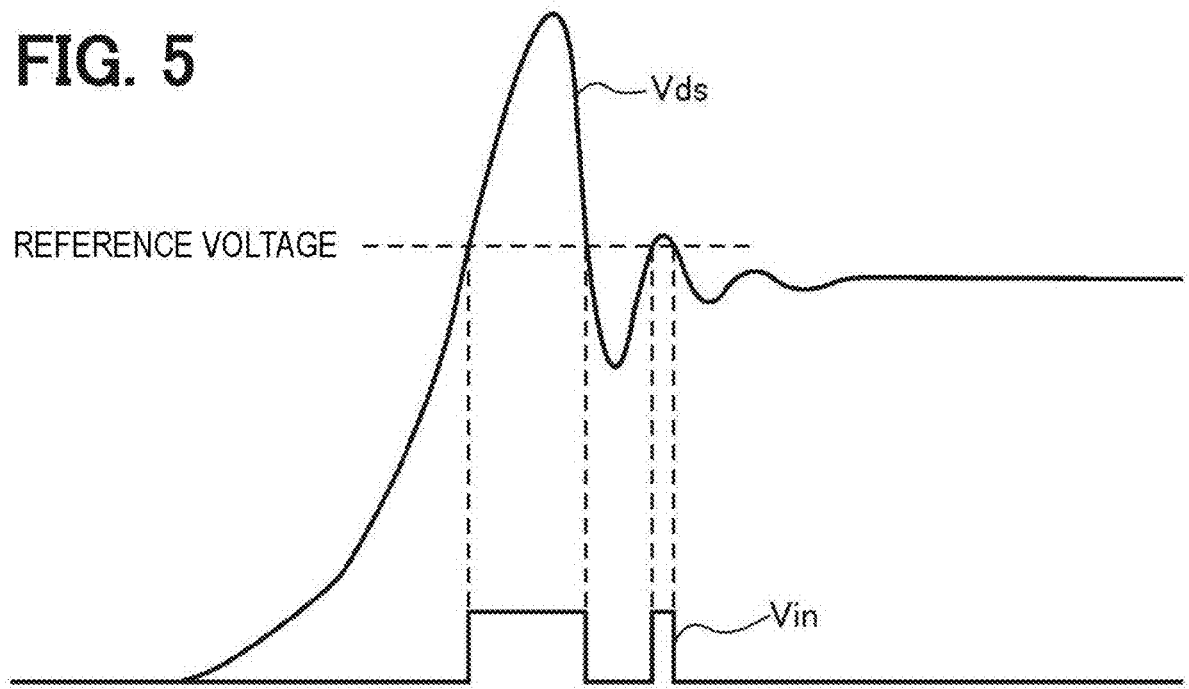
FIG. 5 is a diagram of a waveform of a voltage Vds and a waveform of a pulse signal Vin.

As shown in FIG. 5, for example, when the voltage of the DC power supply 3 is about 12 V, at a timing of turning off of the FET 1N, a surge voltage exceeding 18 V is generated between the drain and the source. By comparing this surge voltage Vds with a reference voltage of about 12 V, the pulse signal Vin is generated.

A detection circuit 5 of the present embodiment detects (i) a rise edge of the pulse signal Vin corresponding to a timing at which the surge voltage Vds first exceeds the reference voltage, and (ii) a fall edge of the pulse signal Vin corresponding to a timing at which the surge voltage Vds firstly falls below the reference voltage thereafter. In the present embodiment, the rise edge corresponds to a first edge, and the fall edge corresponds to a second edge.

A rise edge detection signal output by the detection circuit 5, which is designated as OUT1, and a fall edge detection signal output by the detection circuit 5, which is designated as OUT2 are respectively input via a digital control circuit 8 to a gate drive control circuit 6 that outputs drive signals to gates of the FET 1P and 1N. The gate drive control circuit 6 performs a control such as adjusting the output timing of the drive signal based on the detection signals OUT1 and OUT2. Further, the digital control circuit 8 outputs a reset signal Reset to the detection circuit 5. The measurement circuit 4 and the detection circuit 5 constitute a pulse edge detection circuit 7.

As shown in FIG. 1, the pulse signal Vin is input to a set terminal S of an RS flip-flop 11 and to an input terminal of a NOT gate 12. A reset signal Reset is input to a reset terminal R of the RS flip-flop 11. An output terminal of the NOT gate 12 is connected to the set terminal S of the RS flip-flop 13. Hereinafter, "flip-flop" is referred to as "FF".

An output terminal Q of the RSFF 11 is connected to an input terminal of a NOT gate 14. An output terminal of the NOT gate 14 is connected to the reset terminal R of the RSFF 13 via a delay circuit 15. The output terminals Q of the RSFFs 11 and 13 output the signals OUT1 and OUT2, respectively. The RSFFs 11 and 13 correspond to the first and second edge detection units, respectively, and correspond to a first and second latch circuits, respectively.

Next, an operation of the present embodiment is described.

Figure 2:
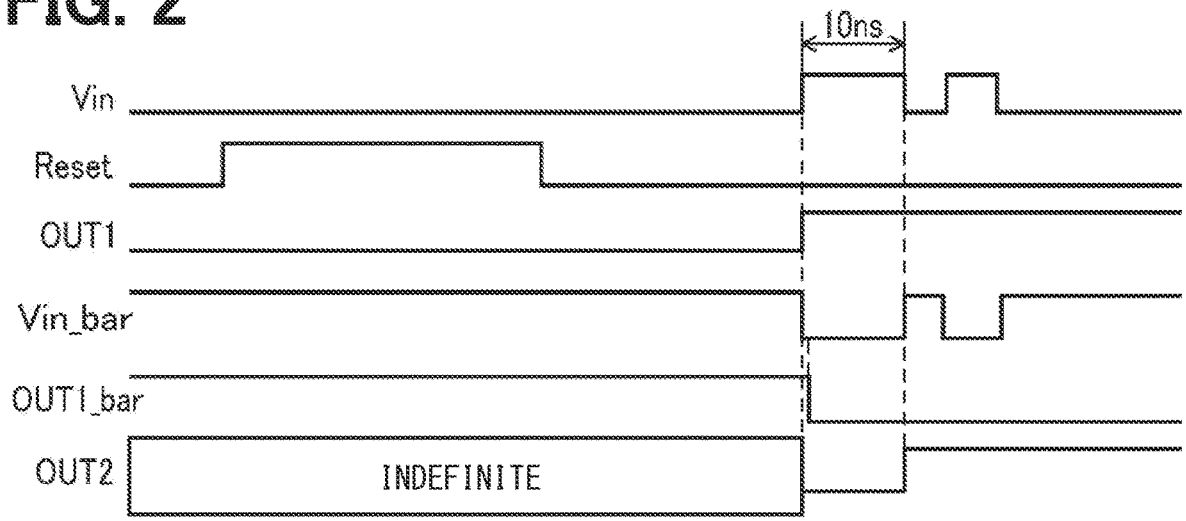
FIG. 2 is a timing chart of the operation of the pulse edge detection circuit.

As shown in FIG. 2, when the RSFF 11 is reset in an initial state, and the pulse signal Vin is at a low level, set and reset in the RSFF 13 become active at the same time. As a result, the signal OUT2 becomes "indefinite", but there is no problem as long as it is a timing before the signal OUT1 becomes high and active. The digital control circuit 8 sets the signal Reset to a high level prior to turning off the FET 1N, and resets the RSFF 11 again.

Thereafter, when the voltage Vds exceeds the reference voltage and the pulse signal Vin becomes a high level due to the turn-off of the FET 1N, the RSFF 11 is set, and the signal OUT1 becomes a high level. Then, an inverted signal OUT1_bar of the signal OUT1 is given to the reset terminal R via the delay circuit 15, thereby releasing the reset of RSFF 13.

Next, when the voltage Vds drops and falls below the reference voltage, the inverted signal Vin_bar of the pulse signal Vin becomes a high level, the RSFF 13 is set, and the signal OUT2 becomes a high level. That is, an interval between the rise edges of the signals OUT1 and OUT2 corresponds to a pulse width of the pulse signal Vin, for example, 10 ns. Thereafter, even when the voltage Vds exceeds the reference voltage again due to ringing, and the pulse signal Vin becomes a high level, the signals OUT1 and OUT2 latched by the RSFFs 11 and 13 do not change.

Herein, a delay time given to the signal OUT1_bar by the delay circuit 15 is described.

Figure 3:
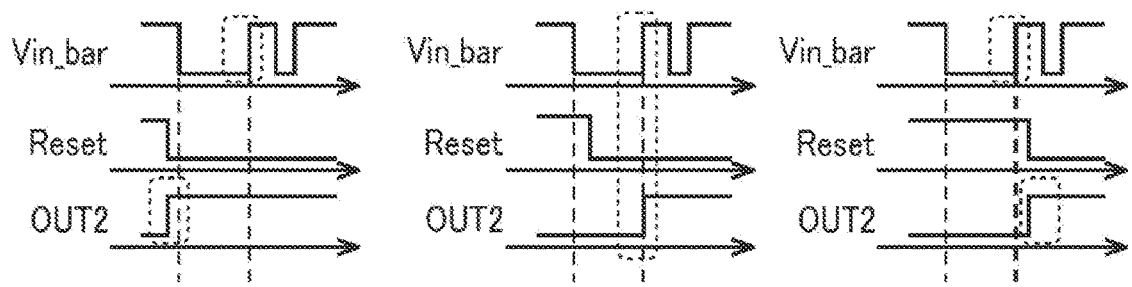
FIG. 3 is a diagram of the effect of a delay time given by a delay circuit.
Figure 4:
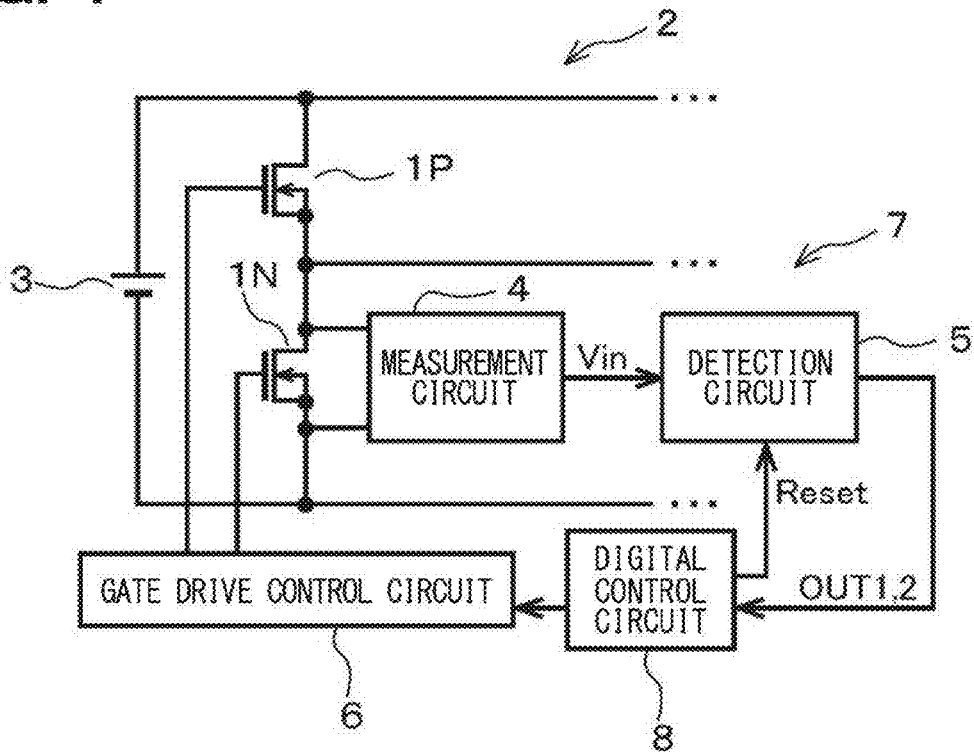
FIG. 4 is a diagram of an application example of the pulse edge detection circuit.

As shown in FIG. 3, when the reset of the RSFF 13 is released during a period in which the signal Vin_bar indicates a high level before the voltage Vds first exceeds the reference voltage, the signal OUT2 changes to a high level at an early timing. On the other hand, when the reset of the RSFF 13 is released immediately after the voltage Vds first falls below the reference voltage, the signal OUT2 changes to a high level at a late timing. Therefore, when the pulse width of the pulse signal Vin is assumed to be, for example, about 10 ns, it is desirable to set the delay time in the delay circuit 15 to less than 10 ns.

As described above, according to the present embodiment, in the pulse edge detection circuit 7, the comparator in the measurement circuit 4 compares the voltage Vds with the reference voltage and outputs the pulse signal Vin. The RSFF 11 raises the signal OUT1 to a high level at the timing at which the pulse signal Vin changes to a high level, i.e., when a rise edge is detected. As a result, in the RSFF 13, the set signal becomes inactive, the reset signal becomes active, and the fall edge of the pulse signal Vin becomes detectable. Then, when the pulse signal Vin changes from high level to low level, and a fall edge occurs, the set signal of the RSFF 13 becomes active, and the signal OUT2 rises to high level.

In a high level pulse signal, a rise edge is generated, and then a fall edge is generated. Therefore, the timing, at which the fall edge can be detected in the RSFF 13, is controlled by the signal OUT1 output by the RSFF 11 at a rise edge generation timing. Specifically, the reset of the RSFF 13 is released by an inverted level of the signal OUT1. As a result, even when a generation interval between the two edges is short because the pulse signal Vin is high speed, the RSFF 13 is enabled to detect the fall edge without using a high speed clock signal.

Further, the delay circuit 15 for delaying the timing of releasing the reset of the RSFF 13 by the inverted level of the signal OUT1 is provided. Therefore, a setup time and a hold time are sufficiently reservable when the RSFF 13 detects the fall edge generated after the reset of the RSFF 13 is released. Then, the delay time of the delay circuit 15 is set to be less than the pulse width time assumed for the pulse signal Vin, and therefore, the RSFF 13 is enabled to reliably detect the fall edge.

Second Embodiment

Hereinafter, the identical parts as those in the first embodiment are designated by the same reference numerals for simplification of the description. Only differences from the first embodiment will be described below.

Figure 6:
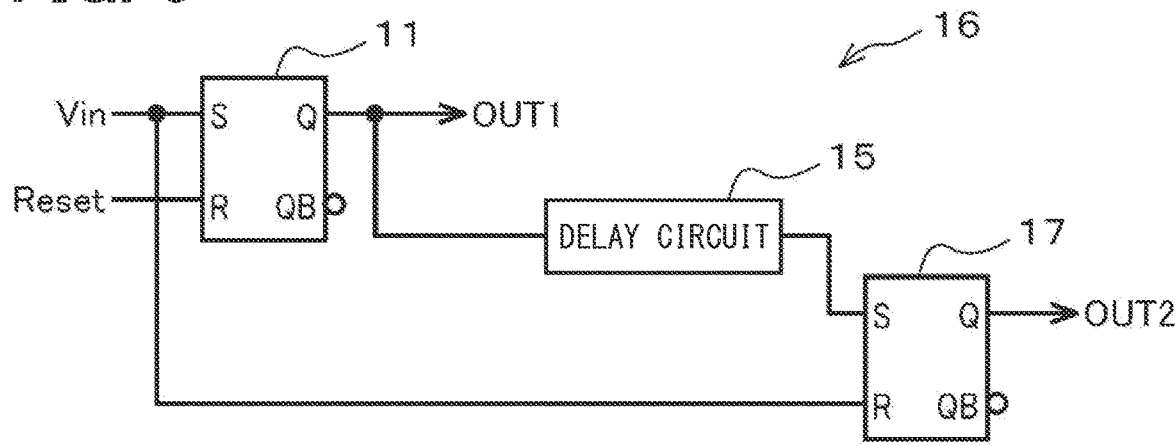
FIG. 6 is a diagram of the pulse edge detection circuit in a second embodiment.

As shown in FIG. 6, a pulse edge detection circuit 16 of the second embodiment replaces the RSFF 13 with a RSFF 17 of the negative logic input, and the NOT gates 12 and 14 are deleted accordingly. Further, the output terminal of the delay circuit 15 is connected to the set terminal S of the RSFF 17, and the pulse signal Vin is connected to the reset terminal R.

Figure 7:
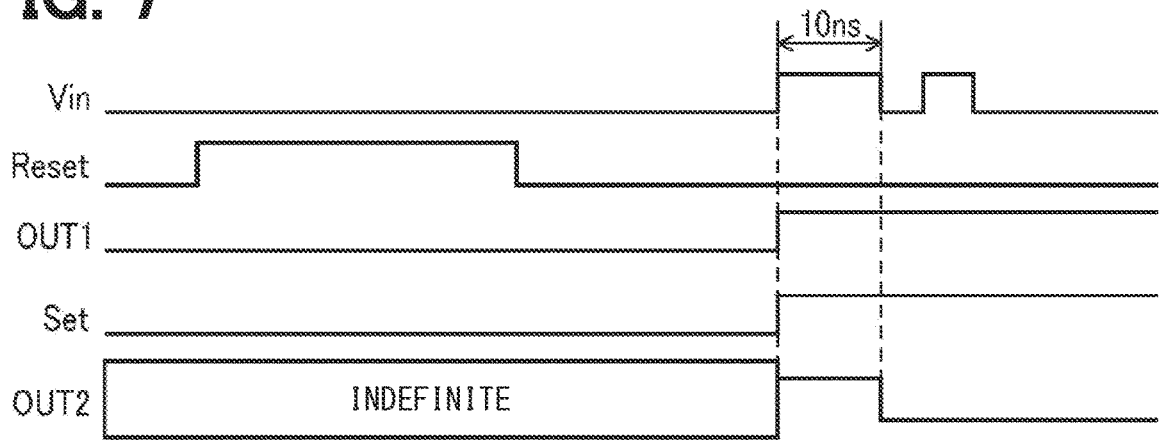
FIG. 7 is a timing chart of the operation of the pulse edge detection circuit.

As shown in FIG. 7, in a period during which both the signal Vin and the signal OUT1 show a low level, the RSFF 17 is indefinite as in the first embodiment. Then, when the signal Vin becomes high level and the signal OUT1 also becomes high level, both the set and reset of the RSFF 17 are released. Thereafter, when the signal Vin becomes low level, the RSFF 17 is reset and the signal OUT2 becomes low level. In such case, an interval between the rise edge of the signal OU1 and the fall edge of the signal OU2 indicates a high level pulse width of the signal Vin. According to the pulse edge detection circuit 16 configured as described above, the circuit area size is smaller than that of the pulse edge detection circuit 7 of the first embodiment.

Third Embodiment

Figure 8:
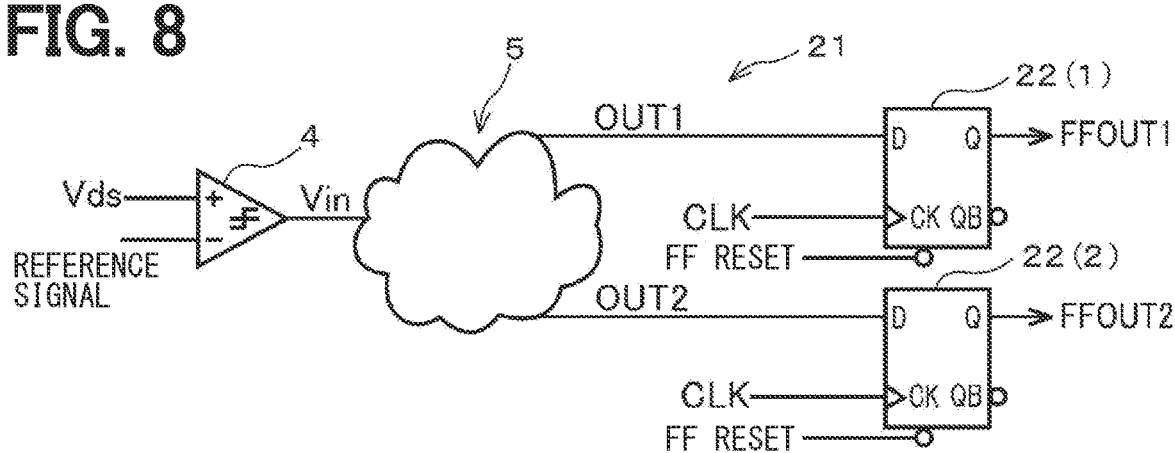
FIG. 8 is a diagram of the pulse edge detection circuit in a third embodiment.

In a pulse edge detection circuit 21 of the third embodiment shown in FIG. 8, for example, a DFF 22 (1) and a DFF 22 (2) are arranged in an output stage of the detection circuit 5 of the first embodiment, and the signals OUT1 and OUT2 are output in synchronization with a clock signal CLK. The DFF 22 (1) and the DFF 22 (2) correspond to first and second clock synchronization circuits, respectively. The frequency of the clock signal CLK is, for example, 100 MHz.

Figure 9:
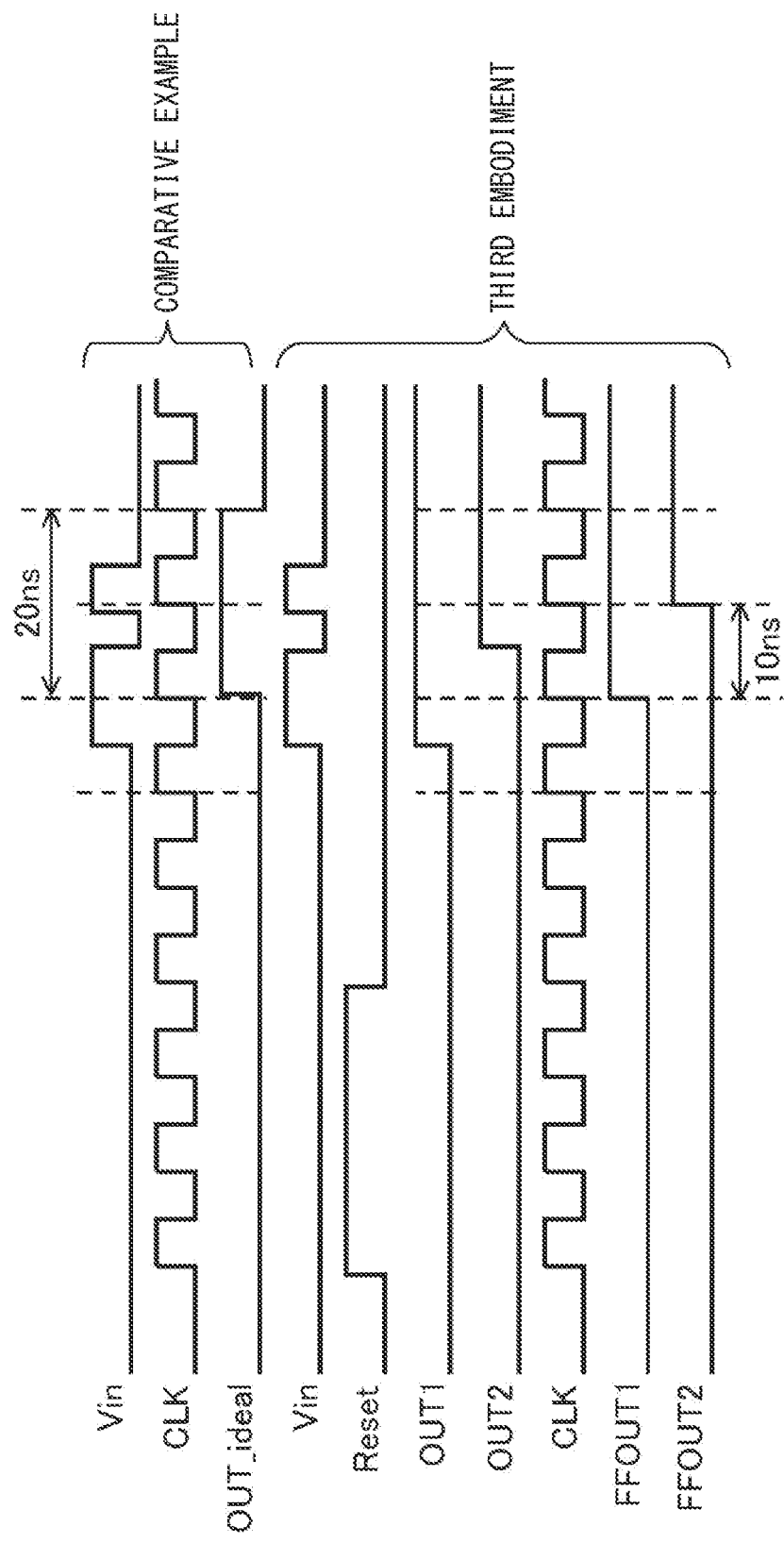
FIG. 9 is a timing chart of the operation of the pulse edge detection circuit.

FIG. 9 shows a signal OUT_ideal when the pulse signal Vin is simply output in clock synchronization with only one DFF instead of the pulse edge detection circuit 21 according to a comparison. In such case, since the second pulse of the pulse signal Vin is also triggered by the clock signal CLK, the pulse width of the signal OUT_ideal is 20 ns.

On the other hand, in the pulse edge detection circuit 21, the signals OUT1 and OUT2 in which the rise edge and the fall edge are individually detected are output by clock synchronization, so that an edge interval of synchronized signals FFOUT1 and FFOUT2 is equal to the pulse width of the pulse signal Vin, i.e., is 10 ns.

As described above, according to the third embodiment, the pulse edge detection circuit 21 includes the DFF22 (1) and DFF22 22 (2) that output signals OUT1 and OUT2 in synchronization with the clock signal CLK. In such manner, the rise and fall edge generation timings detected by the RSFFs 11 and 13 can be represented by using a cycle of the synchronization clock signal CLK, which serves as a unit of minimum duration of time.

Fourth Embodiment

Figure 10:
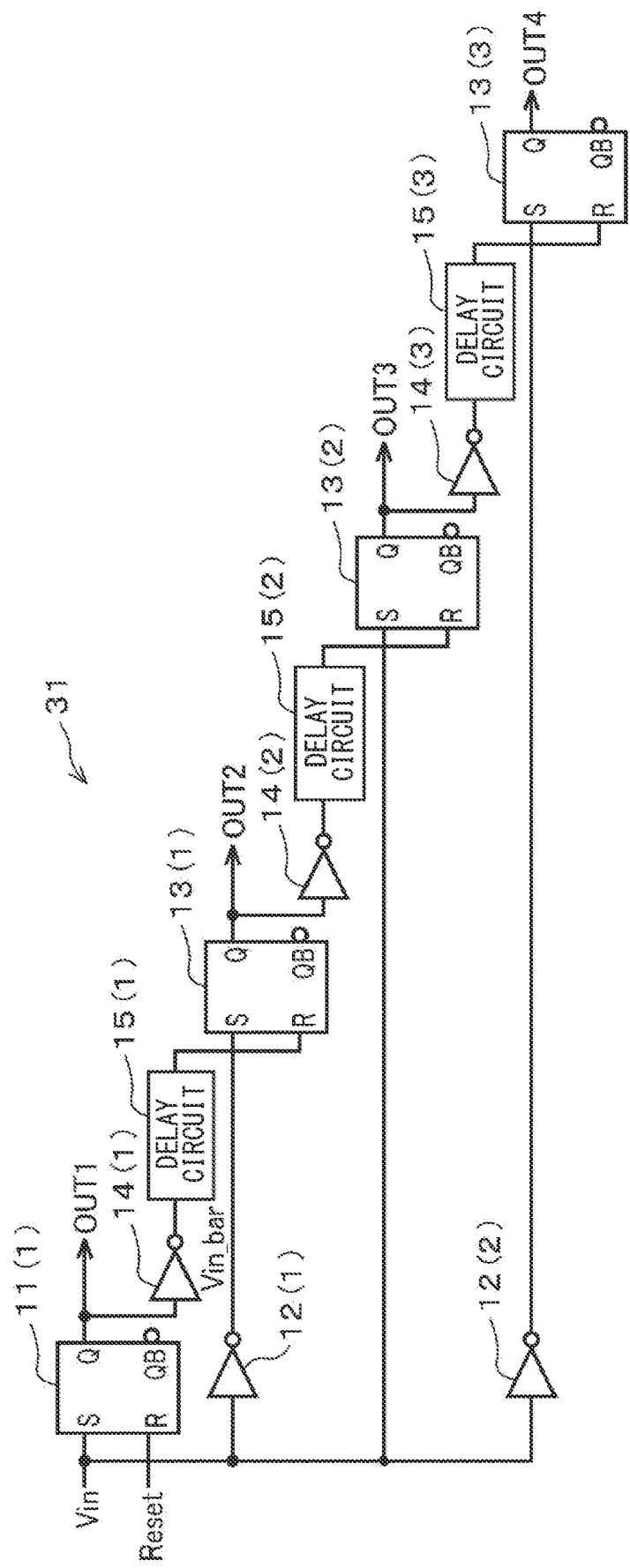
FIG. 10 is a diagram of the pulse edge detection circuit in a fourth embodiment.

A pulse edge detection circuit 31 of the fourth embodiment shown in FIG. 10 has a configuration corresponding to the detection circuit 5 of the first embodiment, and (1) is added to the reference numerals thereof. Further, in the pulse edge detection circuit 31, two sets including the NOT gate 14, the delay circuit 15, and the RSFF 13 are added to the output terminal Q of the RSFF 13 (1), and these are cascade-connected. The added two sets are designated by an addition of reference numerals (2) and (3), respectively.

The pulse signal Vin is given to the set terminal S of the RSFF 13 (2), and the pulse signal Vin via the NOT gate 12 (2) is given to the set terminal S of the RSFF 13 (3). The output terminal Q of the RSFF 13 (2) outputs a signal OUT3, and the output terminal Q of the RSFF 13 (3) outputs a signal OUT4.

Operation of the fourth embodiment is described.

Figure 11:
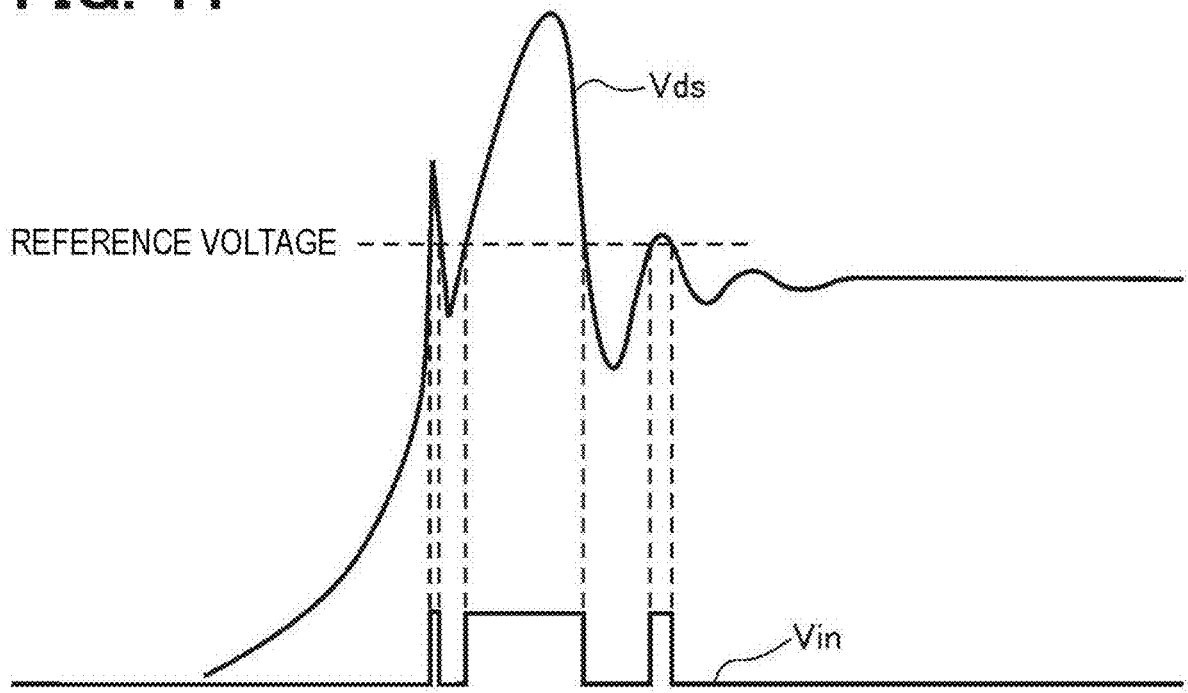
FIG. 11 is a diagram of a waveform of the voltage Vds and a waveform of the pulse signal Vin.

As shown in FIG. 11, the pulse edge detection circuit 31 is configured to provide a counter-measure to a noise, which rides on a target measurement signal, i.e., on a voltage signal, assuming that the noise rides on the signal at a timing after turning off of the FET 1N causing a start of rise of the voltage signal and before exceeding the reference voltage of the measurement circuit 4.

Figure 12:
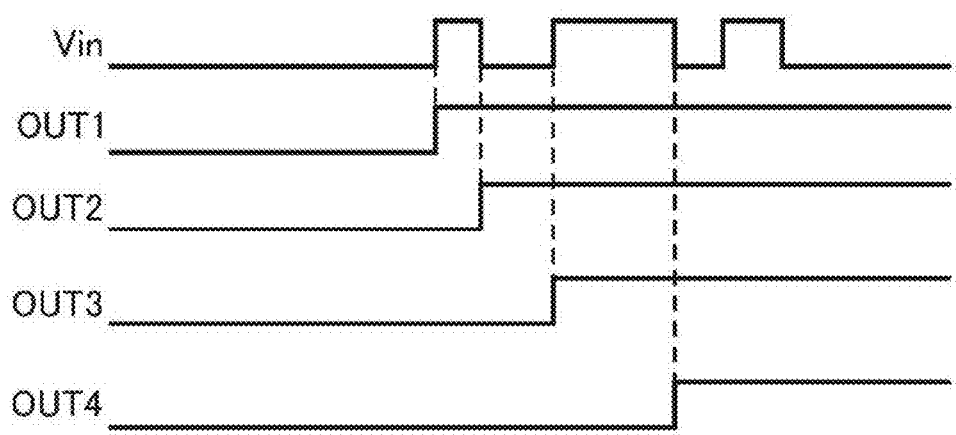
FIG. 12 is a timing chart of the operation of the pulse edge detection circuit.

When the signal is ridden by the noise, as shown in FIG. 12, a pulse due to such noise is generated before a measurement target pulse is generated in the pulse signal Vin. In such manner, the signals OUT1 and OUT2 change to a high level at the generation timings of the rise edge and fall edge of the pulse caused by the noise.

Then, since the reset of the RSFF 13 (2) is released when the signal OUT2 reaches a high level, the signal OUT3 is changed to a high level at the timing of the rise edge of the measurement target pulse generated thereafter.

Along with the above, the reset of the RSFF 13 (3) is released, thereby the RSFF 13 (3) changes the signal OUT4 to a high level at the timing of generation of the fall edge of the measurement target pulse thereafter.

Therefore, according to the pulse edge detection circuit 31 of the fourth embodiment, even when a pulse due to noise is generated before the measurement target pulse in the pulse signal Vin, generation timings of the rise edge and fall edge of the measurement target pulse is detectable by the signals OUT3 and OUT4.

Fifth Embodiment

Figure 13:
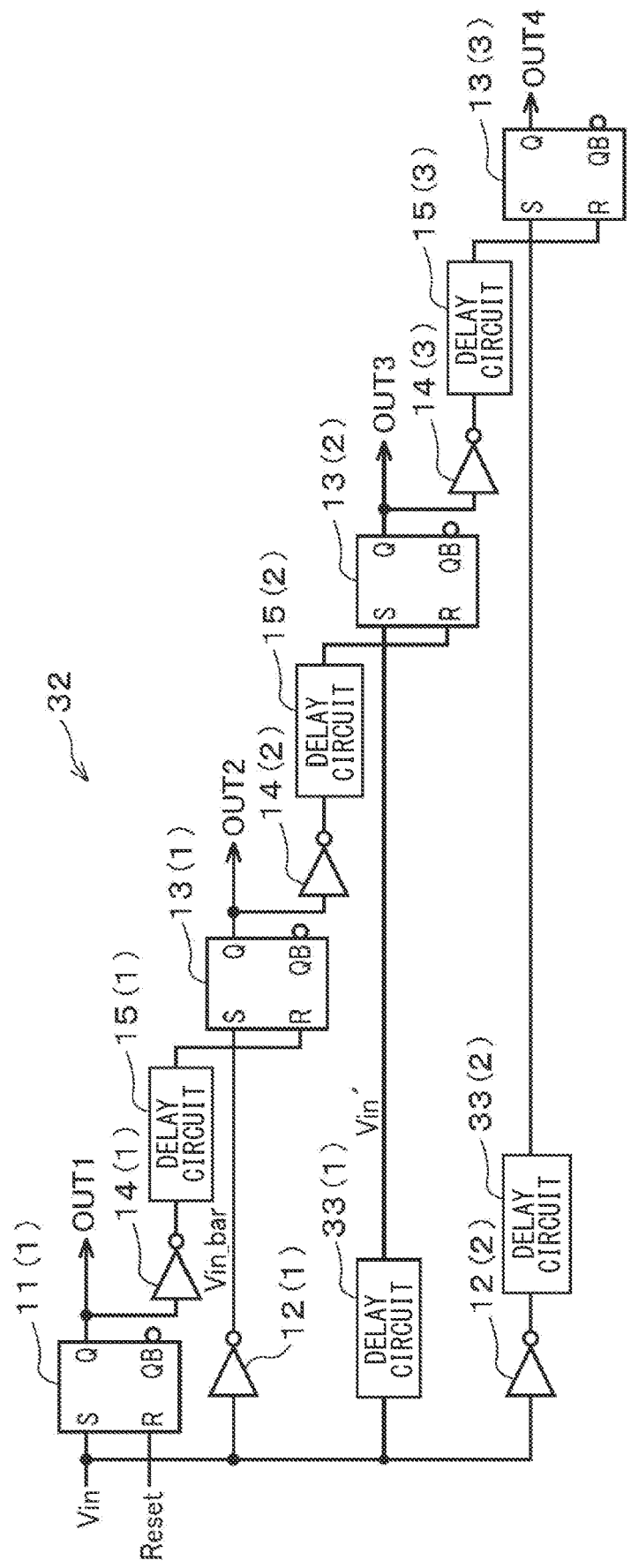
FIG. 13 is a diagram of a pulse edge detection circuit in a fifth embodiment.

A pulse edge detection circuit 32 of the fifth embodiment shown in FIG. 13 has a configuration in which a delay circuits 33 (1) and 33 (2) are added to the pulse edge detection circuit 31. The delay circuit 33 (1) delays the signal Vin and gives it to the set terminal S of the RSFF 13 (2). The delay circuit 33 (2) is inserted at a position between the NOT gate 12 (2) and the set terminal S of the RSFF 13 (3).

Next, operation of the fifth embodiment is described.

Figure 14:
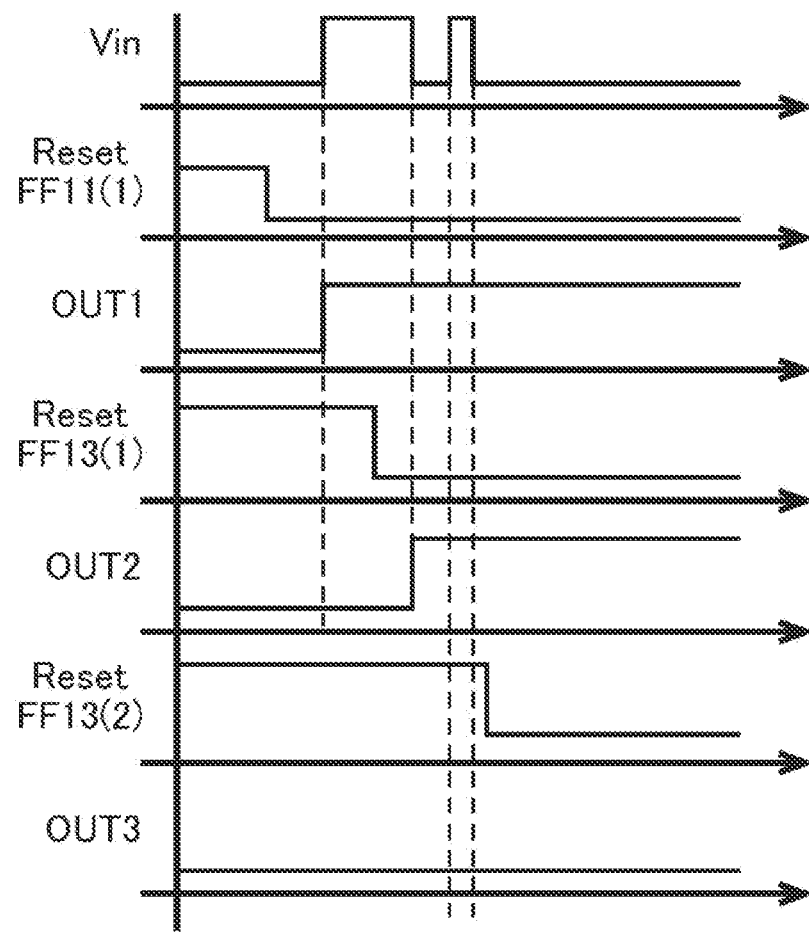
FIG. 14 is a timing chart of an operation when the delay time of RSFF33 (2) becomes too long.

A reset signal is given to the reset terminal R of the RSFF 13 (2) via the delay circuits 15 (1) and 15 (2). Therefore, when the delay time becomes too long, as shown in FIG. 14, the reset release of the RSFF 13 (2) may be delayed, and the reset may be released after the rise edge of the pulse signal Vin is generated. Note that, in an example in FIG. 14, based on an assumption that the signal is not ridden by noise observed in the fourth embodiment, the rise edge and fall edge of the measurement target pulse are detected by the signals OUT1 and OUT2.

Figure 15:
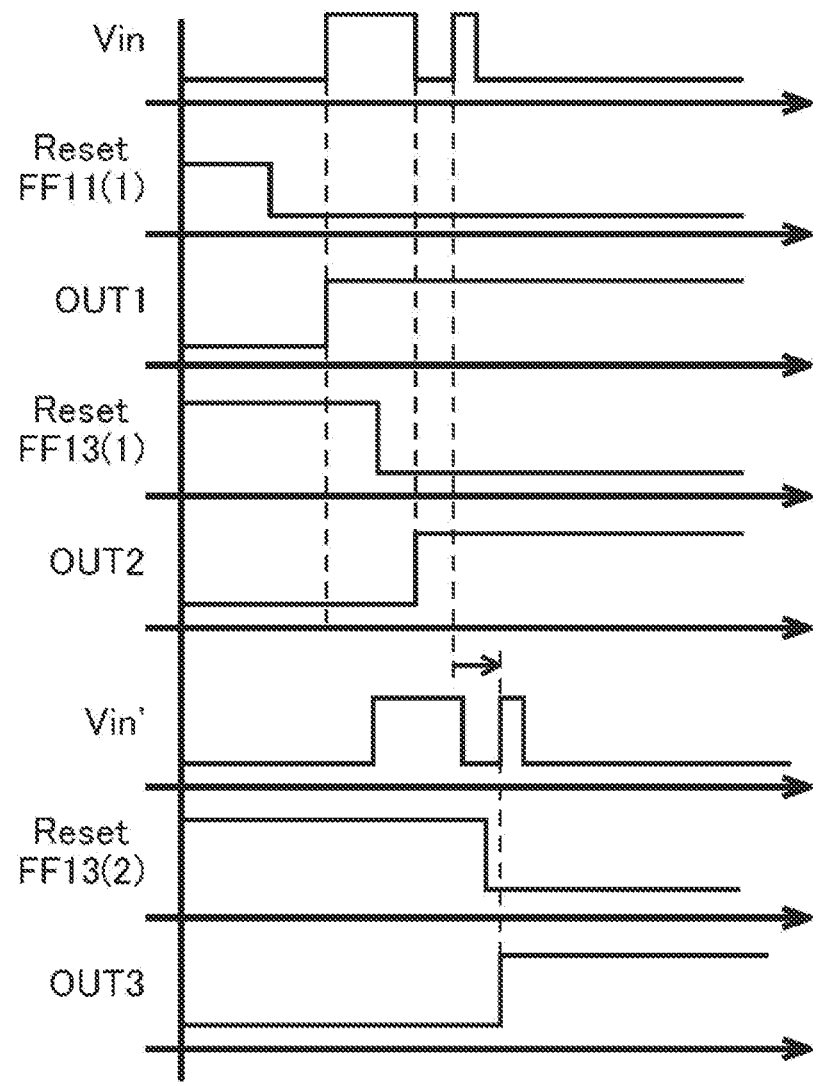
FIG. 15 is a timing chart of the operation of the pulse edge detection circuit.

Therefore, by generating a signal Vin' by delaying the signal Vin by the delay circuit 33 (1), as shown in FIG. 15, the rise edge of the signal Vin' i.e., the rise edge of the pulse generated by ringing in this case, is delayed to a timing after the reset release of the RSFF 13 (2), and is reflected to the signal OUT3. In such manner, even when the reset signal is delayed by passing through the delay circuits 15 (1) and 15 (2), the RSFF 13 (2) can detect the rise edge corresponding to the pulse.

Sixth Embodiment

Figure 16:
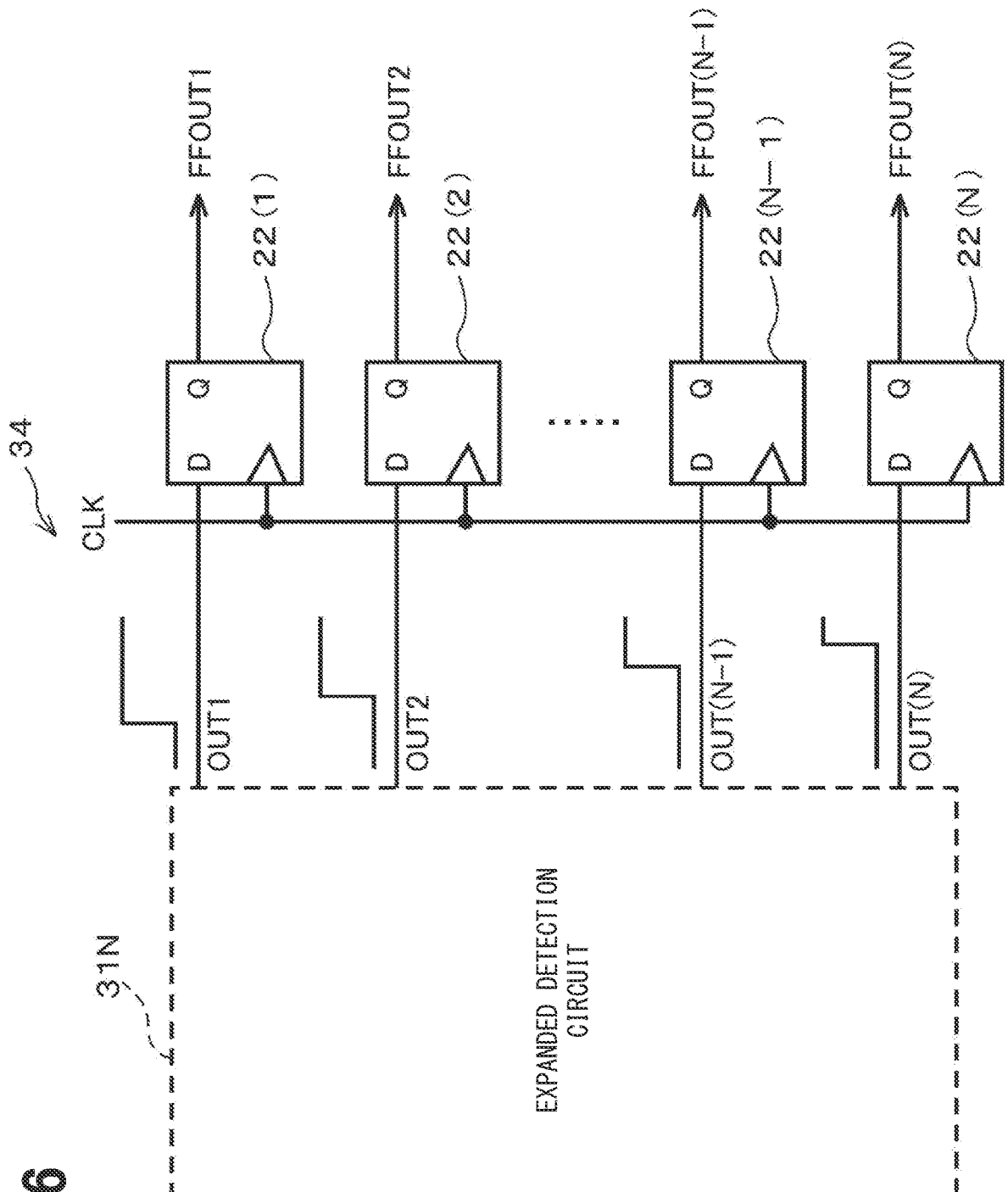
FIG. 16 is a diagram of the pulse edge detection circuit in a sixth embodiment.

A pulse edge detection circuit 34 of the sixth embodiment shown in FIG. 16 includes an expanded detection circuit 31N in which the number of output signals of the pulse edge detection circuit 31 is expanded to N. Note that N is an even number of "6" or more. Then, DFF 22 (1) to DFF 22 (N) are arranged respectively in correspondence to an output terminal OUT1 to OUT (N) of the expanded detection circuit 31N as in the third embodiment. In such manner, signals FFOUT1 to FFOUT (N) are outputtable in synchronization with the clock signal CLK as in the third embodiment.

Seventh Embodiment

Figure 17:
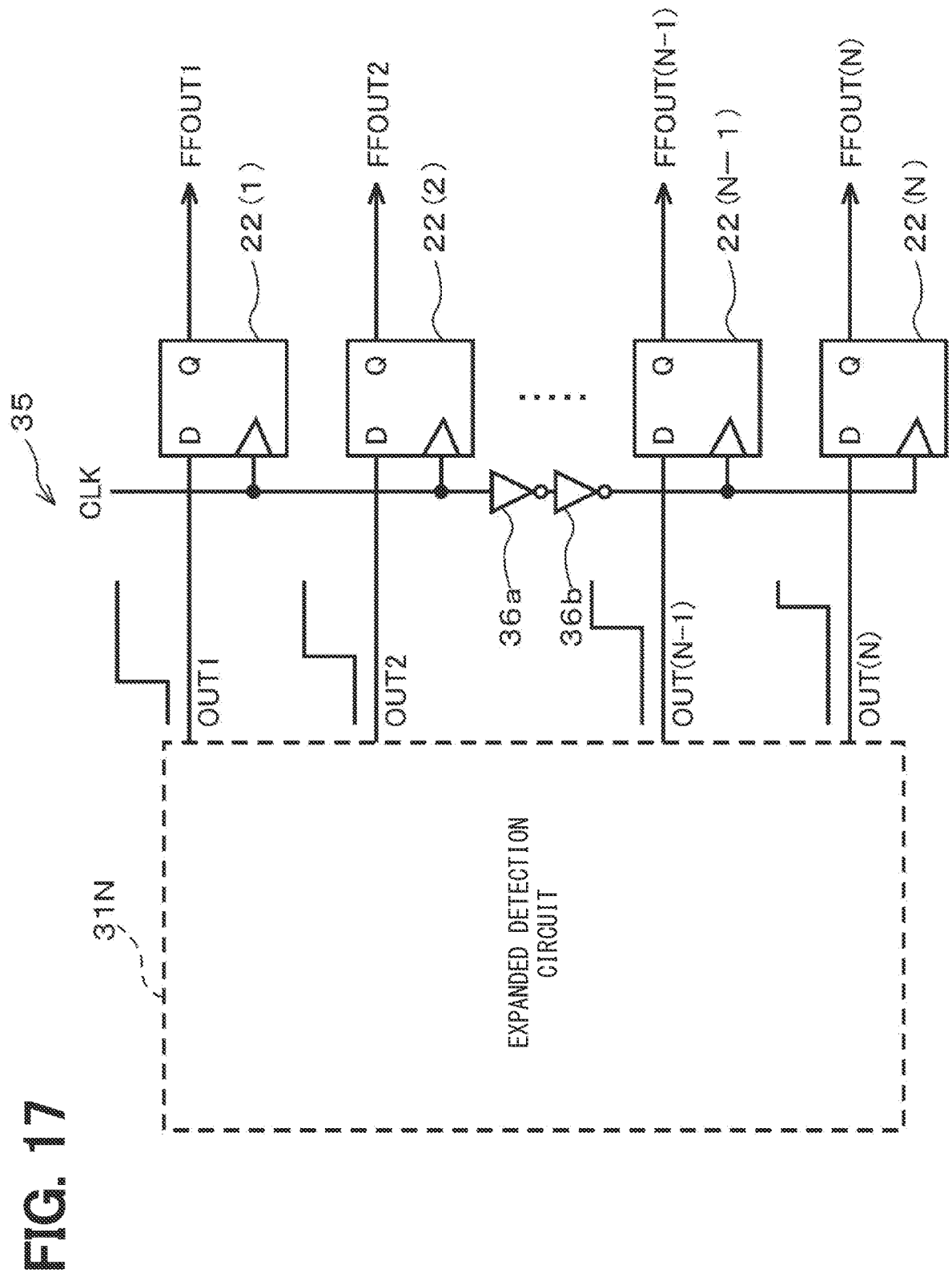
FIG. 17 is a diagram of the pulse edge detection circuit in a seventh embodiment.

A pulse edge detection circuit 35 of the seventh embodiment shown in FIG. 17 has a configuration in which a series circuit of NOT gates 36a and 36b is added to the pulse edge detection circuit 34. This series circuit is inserted to a position between the clock terminal of the DFF 22 (2) and the clock terminal of the DFF 22 (N−1). Regarding the pulse edge detection circuit 34, when an accumulation of delay time becomes a problem as described in the fifth embodiment, the clock signal CLK may be delayed by the NOT gates 36a and 36b to adjust the timing.

Eighth Embodiment

In the eighth embodiment, for example, when the pulse edge detection circuit 31 is used, a method of distinguishing, in the digital control circuit 8 to which the output signals OUT1 to OUT4 are input, (i) an edge of the pulse caused by noise from (ii) an edge of the measurement target pulse is shown. The control circuit 8 controls the timing at which the FET 1N is turned off, and also controls the timing at which the reset signal is output to the pulse edge detection circuit 31.

Figure 18:
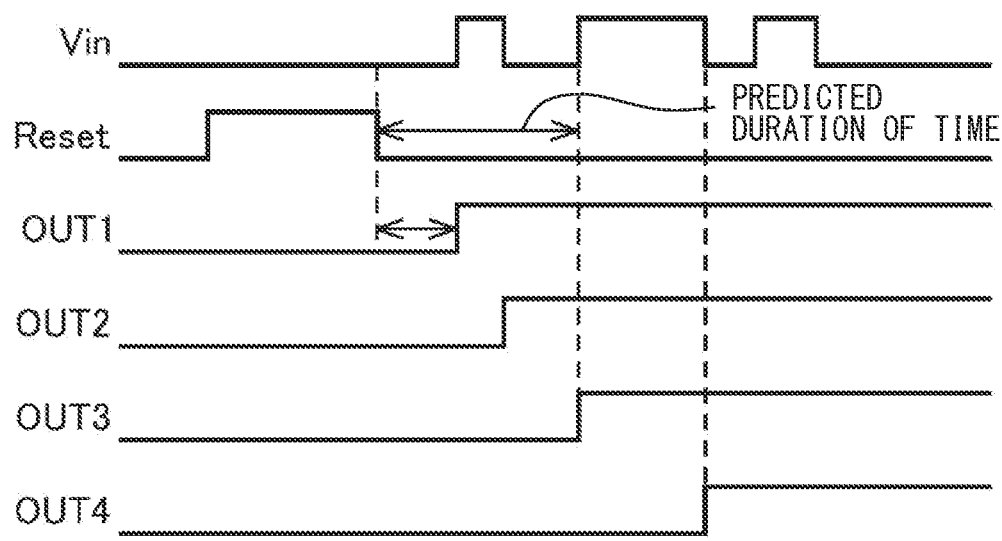
FIG. 18 is a diagram of how to distinguish edges of the pulse caused by noise and edges of measurement target pulses in a gate drive control circuit to which output signals OUT1 to OUT4 are input when the pulse edge detection circuit of the fourth embodiment is used in an eighth embodiment.

Therefore, the control circuit 8 can predict in advance the time at which the rise edge of the measurement target pulse is expected to occur after the reset of the pulse edge detection circuit 31 is released. That is, in FIG. 18, a period of time from (i) a timing at which the reset signal is changed from the high level to the low level to (ii) a timing at which the signal OUT3 is changed to the high level corresponds to a "predicted duration of time". When no noise rides on the signal, the signal OUT1 should change to the high level in the "predicted duration of time".

Therefore, when the period of time from (i) the timing at which the reset signal is changed to the low level to (ii) the timing at which the signal OUT1 is changed to the high level is apparently shorter than the "predicted duration of time", the signals OUT1 and OUT2 are ignored, treating the signals OUT3 and OUT4 as detection signals for the rise edge and fall edge of the measurement target pulse.

Ninth Embodiment

Figure 19:
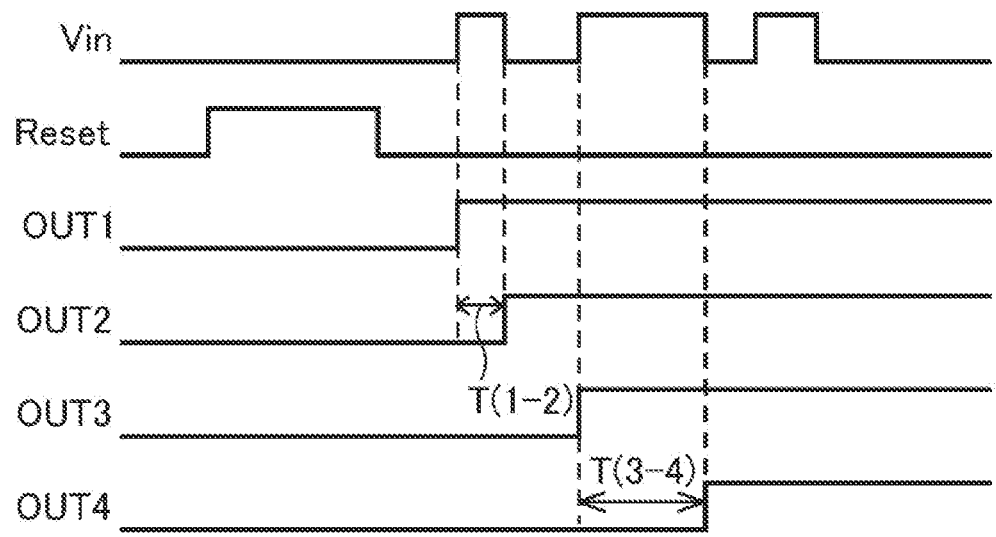
FIG. 19 is a diagram of how to distinguish edges of the pulse caused by noise and edges of measurement target pulses in a gate drive control circuit to which output signals OUT1 to OUT4 are input when the pulse edge detection circuit of the fourth embodiment is used in a ninth embodiment.

Similar to the eighth embodiment, the ninth embodiment also shows a method of distinguishing (i) an edge of the pulse caused by noise and (ii) an edge of the measurement target pulse in the digital control circuit 8. The control circuit 8 should be able to predict in advance how long the pulse width of the measurement target pulse is. Therefore, as shown in FIG. 19, a generation interval T(1-2) of the signals OUT1 and OUT2 and a generation intervals T(3-4) of the signals OUT3 and OUT4 are constantly measured. When the predicted pulse width is, for example, around 10 ns, the following might be observed.

T(1-2)=3 ns

T(3-4)=10 ns

In such case, a logic may well be configured to determine that T(1-2) is a width of a pulse generated by noise, and T(3-4) is a width of the measurement target pulse.

Tenth Embodiment

Figure 20:
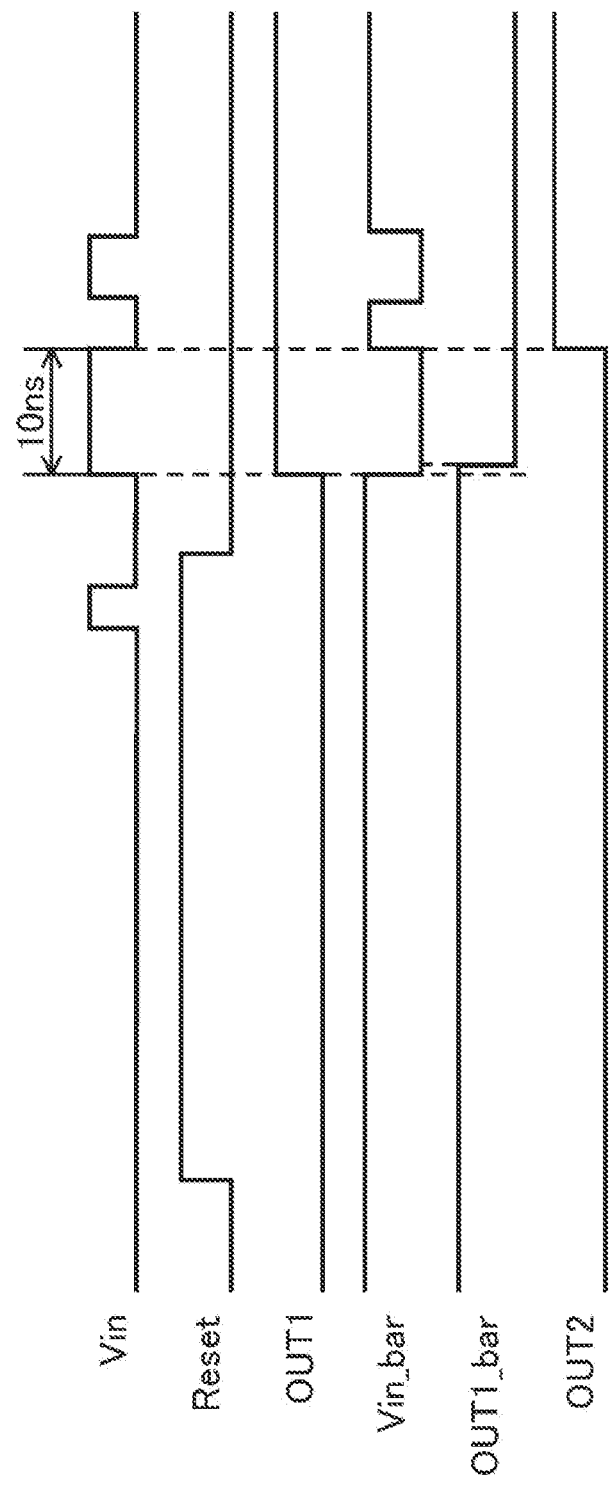
FIG. 20 is a diagram of a method of eliminating an influence of noise in advance in the gate drive control circuit in a tenth embodiment.

A tenth embodiment shows a method of eliminating the influence of noise in advance in the digital control circuit 8. As shown in FIG. 20, the control circuit 8 can eliminate the influence of the pulse that is generated under the influence of noise, by postponing the timing of releasing the reset signal to the vicinity of the timing of the rise edge of the measurement target pulse. By performing such a control, the influence of noise can be eliminated even when the pulse edge circuit 5 is used.

Eleventh Embodiment

Figure 21:
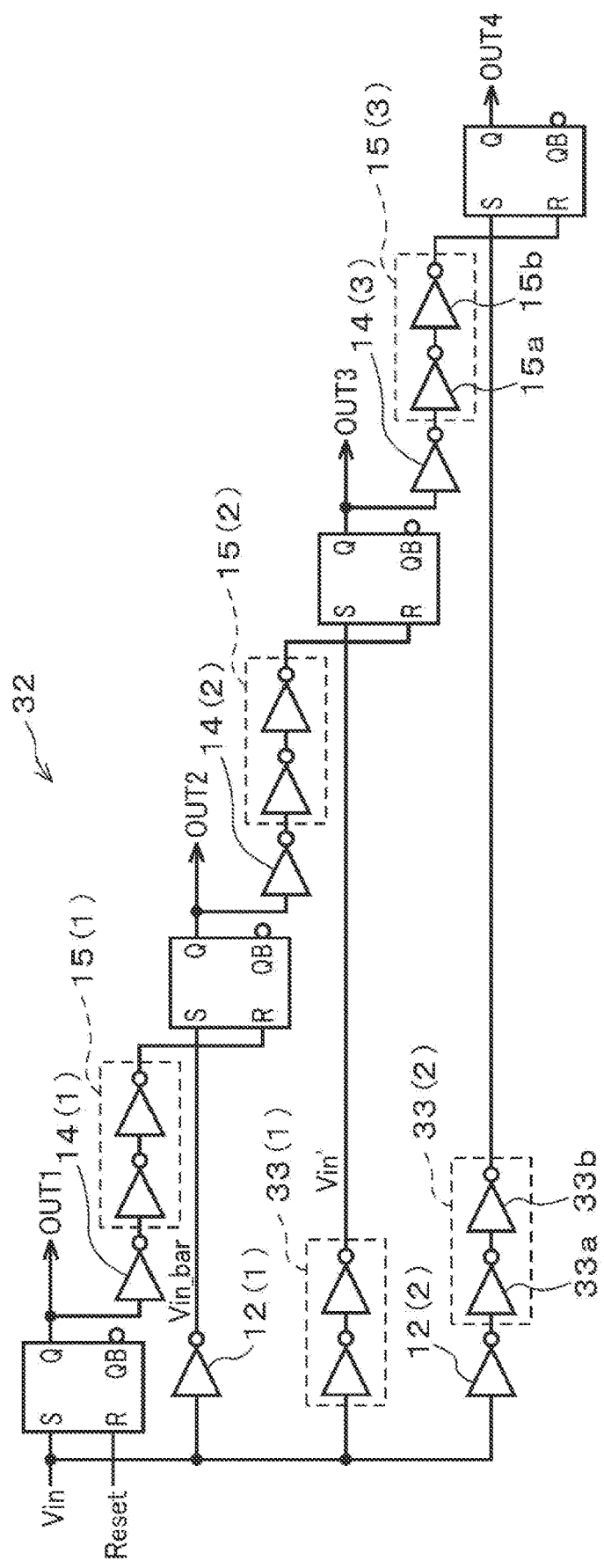
FIG. 21 is a diagram of the pulse edge detection circuit in an eleventh embodiment.
Figure 22:
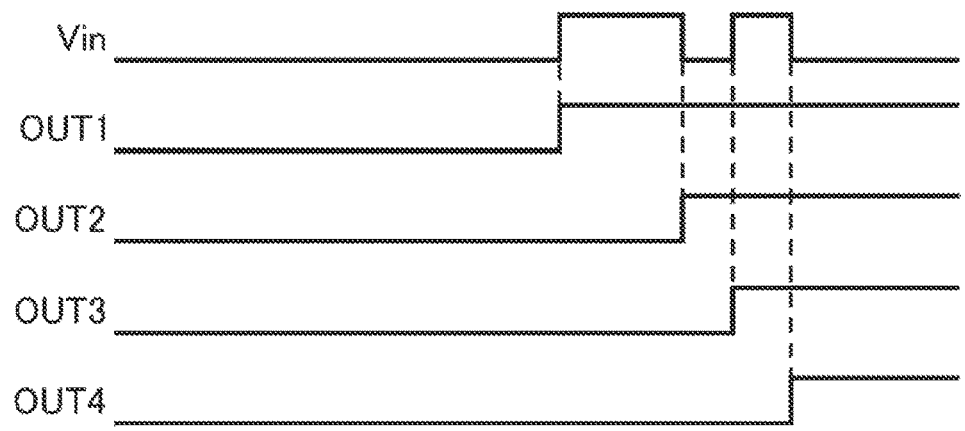
FIG. 22 is a timing chart of the operation of the pulse edge detection circuit.

FIG. 21 shows that the delay circuits 15 and 33 of the pulse edge detection circuit 32 in the fifth embodiment are respectively provided as a series circuit of the NOT gates 15a and 15b and as a series circuit of the NOT gates 33a and 33b. Then, as shown in FIG. 22, the pulse edge detection circuit 32 is not used as a configuration for noise suppression, but is usable as a configuration for outputting the signals OUT1 to OUT4 according to the generation of each edge of the measurement target pulse and the pulse generated by the subsequent ringing.

Twelfth Embodiment

Figure 23:
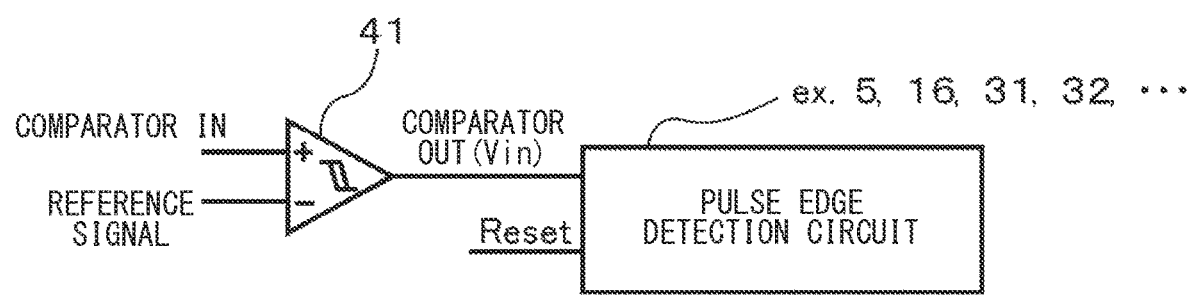
FIG. 23 is a diagram of a comparator with hysteresis used in a measurement circuit in a twelfth embodiment.
Figure 24:
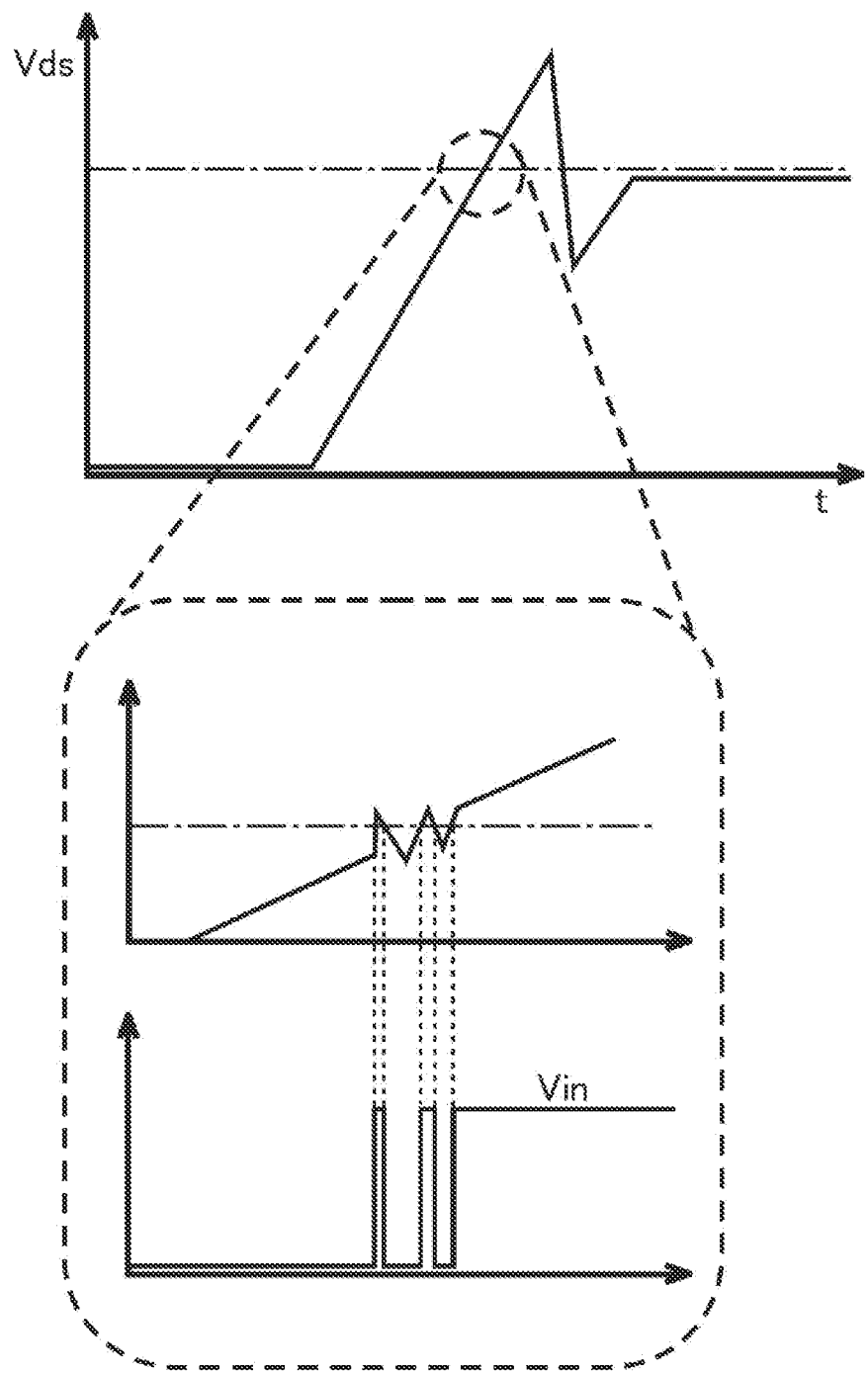
FIG. 24 is a diagram (No. 2) of an example in which noise is removed by the comparator.
Figure 25:
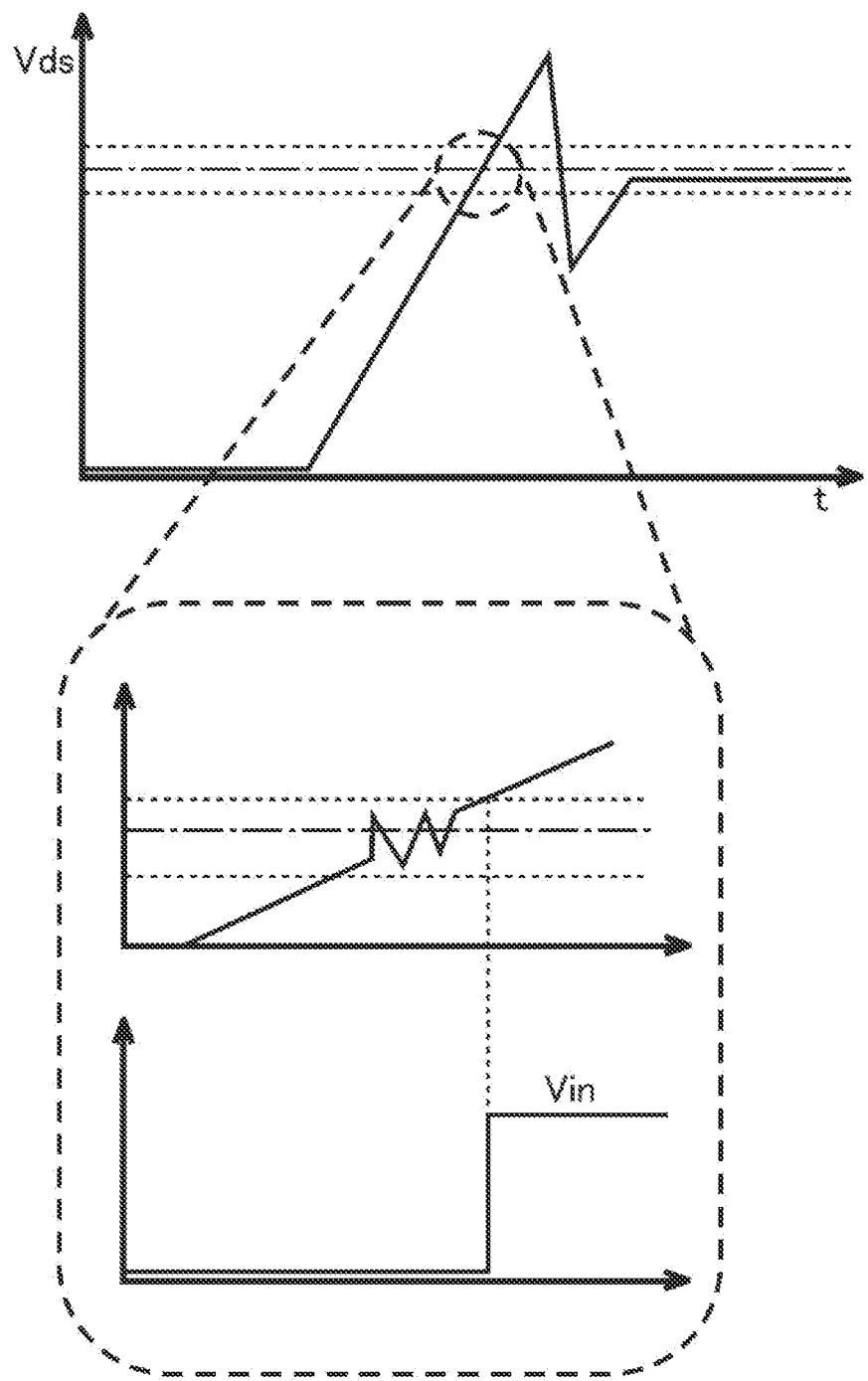
FIG. 25 is a diagram (No. 2) of an example in which noise is removed by the comparator.

In the twelfth embodiment shown in FIG. 23, a comparator with hysteresis is used for a measurement circuit 41 instead of the measurement circuit 4. In such manner, as shown in FIG. 24, when noise rides on the signal when the voltage Vds is going to exceed the reference voltage and a pulse based on such noise is generated, hysteresis characteristics are added on both of a high side and a low side centering on the reference voltage, thereby making it possible to prevent the pulse generation by the noise, as shown in FIG. 25.

Thirteenth Embodiment

Figure 26:
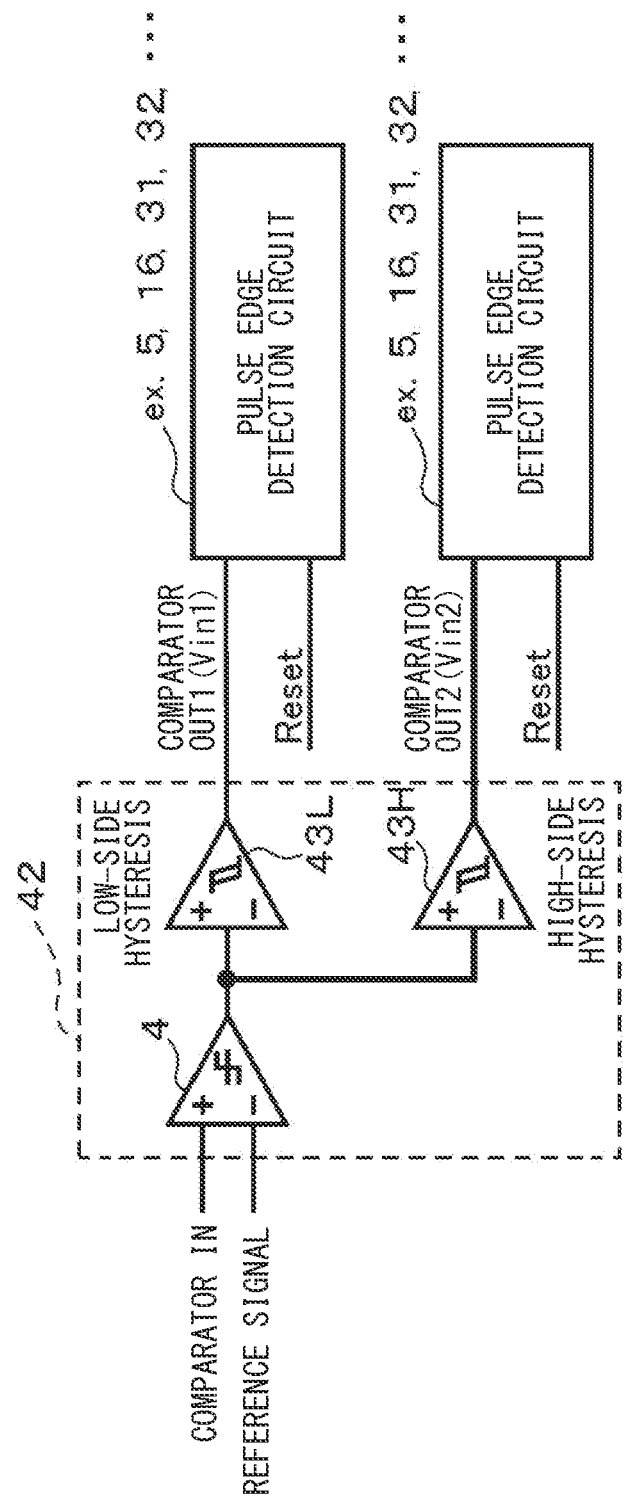
FIG. 26 is a diagram of the comparator with upper and lower hiss used in a measurement circuit in a thirteenth embodiment.

In the thirteenth embodiment shown in FIG. 26, a comparator with hysteresis is also used as a measurement circuit 42, is in this case composed of a comparator 4, a buffer 43L with low-side hysteresis, and a buffer 43H with high-side hysteresis.

Figure 27:
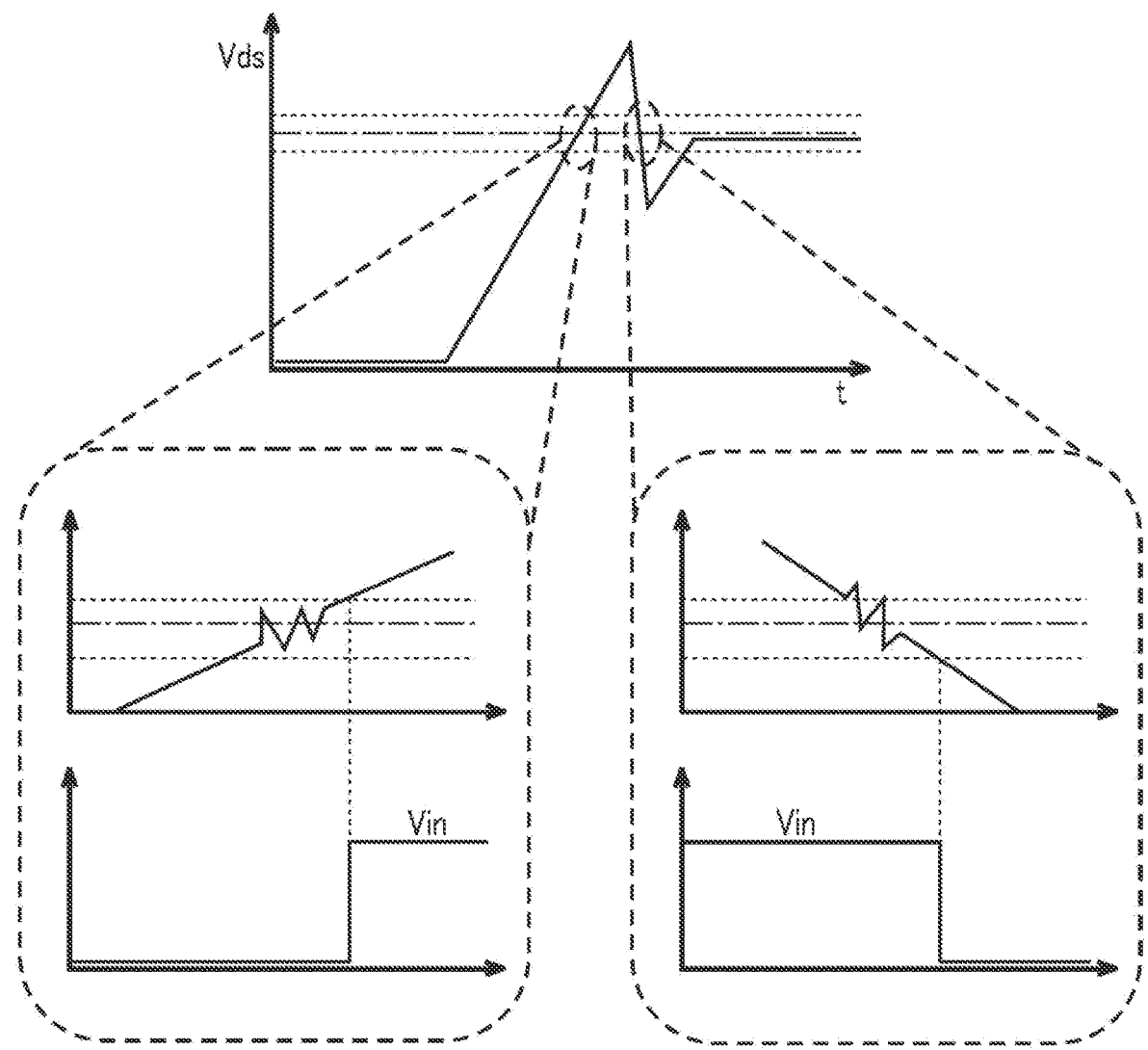
FIG. 27 is a diagram (No. 1) of an example in which noise is removed by the comparator.

As shown in FIG. 27, when hysteresis characteristics are provided on both sides centered on the reference voltage in the measurement circuit 41, the threshold voltage on the high side and the threshold voltage on the low side are different, thereby causing a shift among the rise edge detection timing and the fall edge detection timing.

Figure 28:
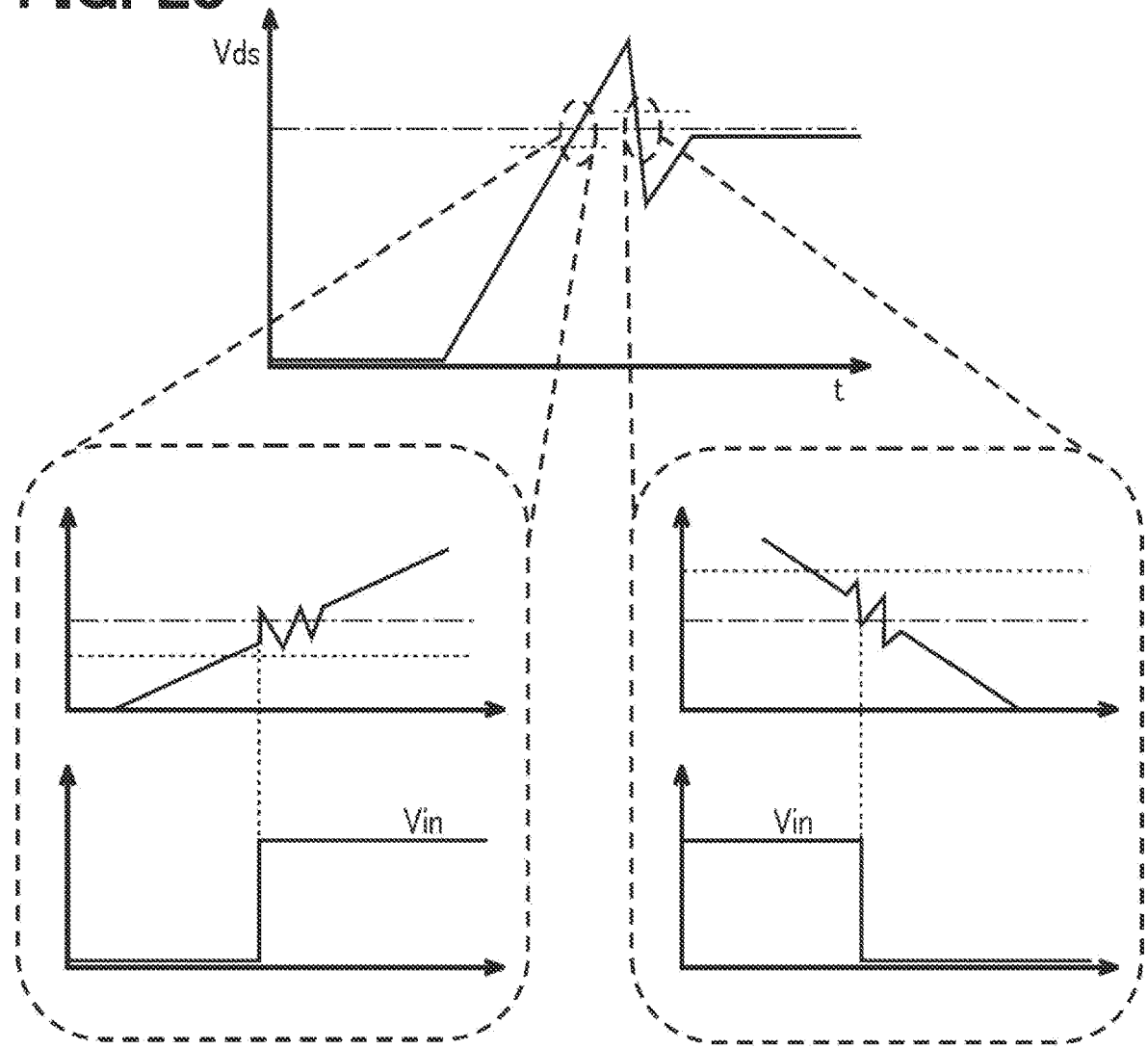
FIG. 28 is a diagram (No. 2) of an example in which noise is removed by the comparator.

On the other hand, in the measurement circuit 42, as shown in FIG. 28, by setting the same reference voltage for the buffers 43L and 43H to provide the low-side hysteresis characteristics and the high-side hysteresis characteristics, respectively, it is possible to measure the pulse width with high accuracy by aligning the timings of the rise edge and the fall edge.

Fourteenth Embodiment

Figure 29:
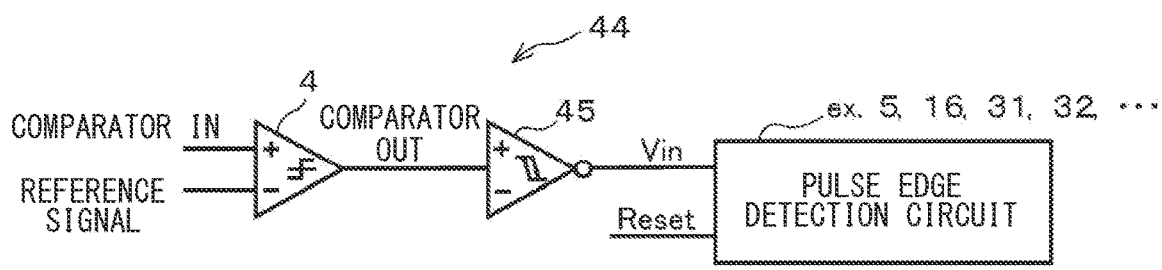
FIG. 29 is a diagram of a Schmidt trigger buffer used in a measurement circuit in a fourteenth embodiment.
Figure 30:
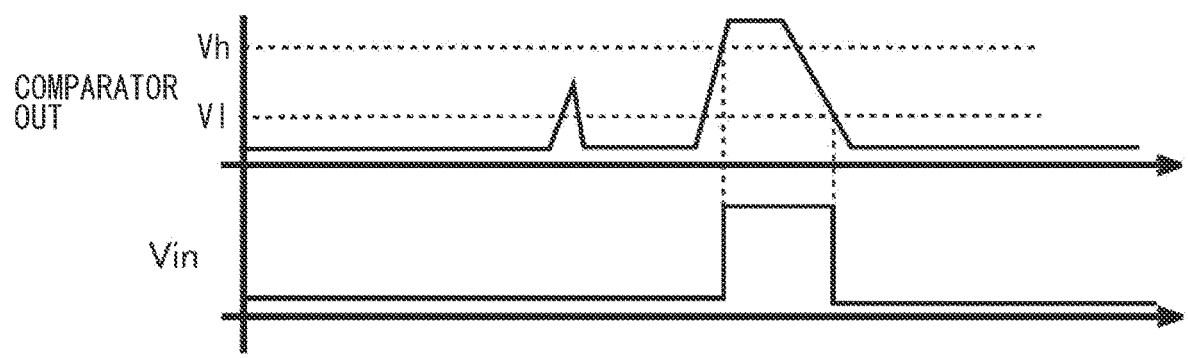
FIG. 30 is a diagram of an example in which noise is removed by the Schmidt trigger buffer.

In the fourteenth embodiment shown in FIG. 29, a measurement circuit 44 is composed of a series circuit of the comparator 4 and a Schmidt trigger buffer 45. In such manner, as shown in FIG. 30, even when the output signal of the comparator 4 is ridden by noise, the noise is suppressible by the hysteresis characteristics of the Schmidt trigger buffer 45.

Fifteenth Embodiment

The fifteenth embodiment shows another configuration example of the delay circuit.

Figure 31:
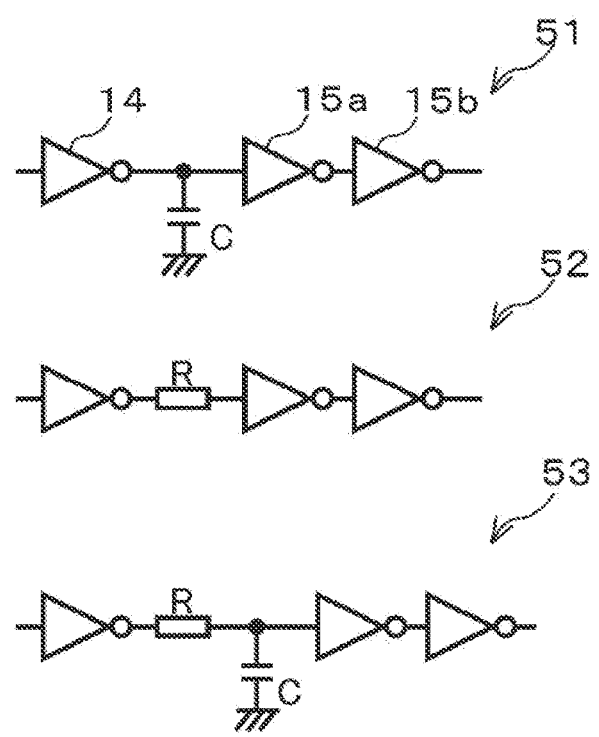
FIG. 31 is a diagram of a configuration example of the delay circuit in a fifteenth embodiment.

FIG. 31 shows delay circuits 51 to 53, in which the delay circuit 51 has a capacitor C connected to a position between the input terminal of the NOT gate 15a and the ground. In the delay circuit 52, a resistor element R is inserted to a position between the output terminal of the NOT gate 14 and the input terminal of the NOT gate 15a, and in the delay circuit 53, a CR filter is configured in the input stage of the NOT gate 15a as a combination of the resistor element R and the capacitor C. Further, the delay circuit may be configured only by the CR filter.

Other Embodiments

The relationship between the first and second edges and the rise and fall edges may be reversed.

When the set signal and the reset signal are active at the same time, for example, an RS flip-flop that gives priority to a reset side may be used.

The delay circuit may be provided as required.

The voltage to be detected is not limited to the drain-source voltage of the FET.

Although the present disclosure has been described in accordance with the embodiments, it is understood that the present disclosure is not limited to the above embodiments or structures. The present disclosure incorporates various modifications and variations within the scope of equivalents. In addition, various combinations and forms are encompassable within the sprit and the scope of the present disclosure, including one element added thereto or subtracted therefrom together with the configuration having more than that or less than that.

What is claimed is:

1. A pulse edge detection circuit comprising:
   a comparator configured to
      compare a voltage signal with a threshold voltage, and
      output a pulse signal, wherein one of a rise edge and a fall edge of the pulse signal is a first edge, wherein an other of the rise edge and the fall edge of the pulse signal is a second edge;
   a first edge detection unit configured to output a first edge detection signal, which rises from a low level to a high level at a timing at which the first edge is generated; and
   a second edge detection unit configured to output a second edge detection signal, which rises from a low level to a high level at a timing at which the second edge is generated,
   wherein
   a timing, at which the second edge detection unit is enabled to detect the second edge, is controlled by the first edge detection signal,
   the first edge detection signal is configured to generate a rise edge when the voltage signal exceeds the threshold voltage, and
   the second edge detection signal is configured to generate a rise edge when the voltage signal falls below the threshold voltage.

2. The pulse edge detection circuit of claim 1, further comprising:
   a first clock synchronization circuit configured to output the first edge detection signal in synchronization with a clock signal; and
   a second clock synchronization circuit configured to output the second edge detection signal in synchronization with the clock signal.

3. The pulse edge detection circuit of claim 1, wherein the first edge detection unit and the second edge detection unit constitute a both edge detection unit, and
   a plurality of both edge detection units, which includes the both edge detection unit, are cascade-connected.

4. The pulse edge detection circuit of claim 1, wherein the pulse signal is configured to exhibit a first level or a second level in two levels,
   the first edge detection unit includes a first latch circuit configured to continuously output the first edge detection signal from a timing, at which the pulse signal changes from the first level to the second level, and
   the second edge detection unit has a second latch circuit configured to continuously output the second edge detection signal from a timing, at which the pulse signal changes from the second level to the first level, wherein an output state of the second latch circuit is configured to be released by the first edge detection signal.

5. The pulse edge detection circuit of claim 4, further comprising:
   a delay circuit configured to delay a timing at which the output state of the second latch circuit is released by the first edge detection signal.

6. The pulse edge detection circuit of claim 5, wherein
a delay time of the delay circuit is set to be less than a predicted duration of time from a timing, at which the first edge detection signal is output, to a timing at which the second edge detection signal is output.

7. The pulse edge detection circuit of claim 4, further comprising:
a control circuit configured to
control a generation timing of the voltage signal and reset the output state of the first latch circuit, wherein
the control circuit is configured to set the first latch circuit in a reset state until a level of the voltage signal reaches a reset release voltage that is set to be lower than a reference voltage of the comparator.

8. The pulse edge detection circuit of claim 1, wherein the comparator is a comparator with hysteresis.

9. The pulse edge detection circuit of claim 8, wherein the comparator with hysteresis is provided as two comparators with one side hysteresis,
one of the two comparators has a high-side hysteresis characteristics, and
an other of the two comparators has a low-side hysteresis characteristics.

10. The pulse edge detection circuit of claim 1, further comprising:
a Schmidt trigger buffer provided in a stage subsequent to the comparator.

11. The pulse edge detection circuit of claim 1, wherein
the pulse signal is configured to exhibit a first level or a second level in two levels,
the first edge detection unit includes a first latch circuit configured to continuously output the first edge detection signal from a timing, at which the pulse signal changes from the first level to the second level,
the second edge detection unit has a second latch circuit configured to continuously output the second edge detection signal from a timing, at which the pulse signal changes from the second level to the first level,
the second edge detection unit has a reset terminal, wherein
an output state of the second latch circuit is configured to be released by inputting an inverted signal of the first edge detection signal to the reset terminal.

12. The pulse edge detection circuit of claim 1, wherein
the first edge detection signal is a pulse signal, and
the second edge detection signal is a pulse signal.

13. The pulse edge detection circuit of claim 1, wherein
the first edge detection unit is configured to output the first edge detection signal, which is the rise edge that rises from the low level to the high level at the timing at which the voltage signal exceeds the threshold voltage and at which the first edge is generated, and
the second edge detection unit is configured to output the second edge detection signal, which is the rise edge that rises from the low level to the high level at the timing at which the voltage signal falls below the threshold voltage and at which the second edge is generated.

14. A pulse edge detection circuit comprising:
a comparator circuit configured to
compare a voltage signal with a threshold voltage, and
output a pulse signal having a rise edge at a timing, at which the voltage signal exceeds the threshold voltage, and having a fall edge at a timing, at which the voltage signal falls below the threshold voltage;
a first edge detector circuit configured to
input the pulse signal, and
output a first edge detection signal, which rises from a low level to a high level at a timing at which the rise edge in the pulse signal is generated; and
a second edge detector circuit configured to
input the first edge detection signal, and
output a second edge detection signal, which rises from a low level to a high level at a timing at which the fall edge in the pulse signal is generated,
wherein
the first edge detector circuit is configured to
output the first edge detection signal to the second edge detector circuit, and
control, by using the first edge detection signal, a timing, at which the second edge detector circuit is enabled to detect the other of the rise edge and the fall edge,
the first edge detection signal is configured to generate a rise edge when the voltage signal exceeds the threshold voltage, and
the second edge detection signal is configured to generate a rise edge when the voltage signal falls below the threshold voltage.

15. The pulse edge detection circuit of claim 14, wherein
the pulse signal is configured to exhibit a first level or a second level in two levels,
the first edge detector circuit includes a first latch circuit configured to continuously output the first edge detection signal from a timing, at which the pulse signal changes from the first level to the second level,
the second edge detector circuit has a second latch circuit configured to continuously output the second edge detection signal from a timing, at which the pulse signal changes from the second level to the first level,
the second edge detector circuit has a reset terminal, wherein
an output state of the second latch circuit is configured to be released by inputting an inverted signal of the first edge detection signal to the reset terminal.

16. The pulse edge detection circuit of claim 14, wherein
the first edge detection signal is a pulse signal, and
the second edge detection signal is a pulse signal.

17. The pulse edge detection circuit of claim 14, wherein
the first edge detector circuit is configured to output the first edge detection signal, which is the rise edge that rises from the low level to the high level at the timing at which the voltage signal exceeds the threshold voltage and at which the first edge is generated, and
the second edge detector circuit is configured to output the second edge detection signal, which is the rise edge that rises from the low level to the high level at the timing at which the voltage signal falls below the threshold voltage and at which the second edge is generated.

* * * * *